United States Patent [19]
Hatano et al.

[11] Patent Number: 5,998,810
[45] Date of Patent: *Dec. 7, 1999

[54] SEMICONDUCTOR LIGHT-EMITTING DIODE HAVING A P-TYPE SEMICONDUCTOR LAYER FORMED ON A LIGHT-EMITTING LAYER

[75] Inventors: Ako Hatano, Tokyo; Yasuo Ohba, Yokohama; Hidetoshi Fujimoto, Kawasaki; Kazuhiko Itaya, Yokohama; Johji Nishio, Kawasaki, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/980,256

[22] Filed: Nov. 28, 1997

Related U.S. Application Data

[63] Continuation of application No. 08/767,673, Dec. 17, 1996, Pat. No. 5,740,192, which is a continuation-in-part of application No. 08/567,982, Dec. 11, 1995, Pat. No. 5,617,438.

[30] Foreign Application Priority Data

Dec. 19, 1994 [JP] Japan .................................. 6-314901
Mar. 26, 1996 [JP] Japan .................................. 8-069590

[51] Int. Cl.$^6$ .................................................. H01L 33/00
[52] U.S. Cl. .......................... 257/102; 257/101; 257/103; 257/94
[58] Field of Search ..................................... 257/101, 102, 257/103, 91, 94

[56] References Cited

U.S. PATENT DOCUMENTS

| | | | |
|---|---|---|---|
| 5,693,963 | 12/1997 | Fujimoto et al. | 257/94 |
| 5,740,192 | 4/1998 | Hatano et al. | 257/101 |
| 5,825,052 | 10/1998 | Shakuda | 257/103 |

FOREIGN PATENT DOCUMENTS 49-29770 3/1974 Japan .

*Primary Examiner*—Minh Loan Tran
*Attorney, Agent, or Firm*—Oblon, Spivak, McClelland, Maier & Neustadt, P.C.

[57] ABSTRACT

A semiconductor light-emitting diode exhibiting an oscillation wavelength of 450 nm or less and comprising a substrate, a lower clad layer formed on or above the substrate and mainly composed of a III–V Group compound semiconductor, an active layer formed directly on the lower clad layer and mainly composed of a III–V Group compound semiconductor, and an upper p-type clad layer formed directly on the active layer and mainly composed of a III–V Group compound semiconductor. This semiconductor light-emitting diode is characterized in that the upper p-type clad layer contains Mg, Si and at least one impurities for compensating residual donors.

8 Claims, 8 Drawing Sheets

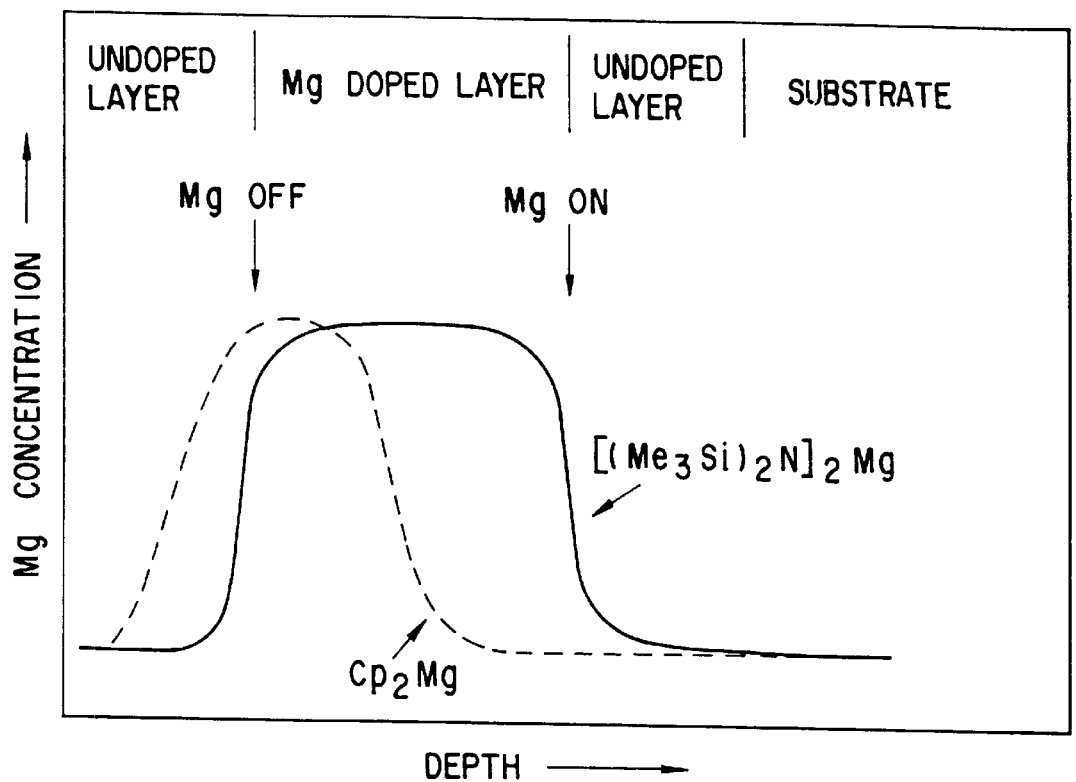
F I G. 1
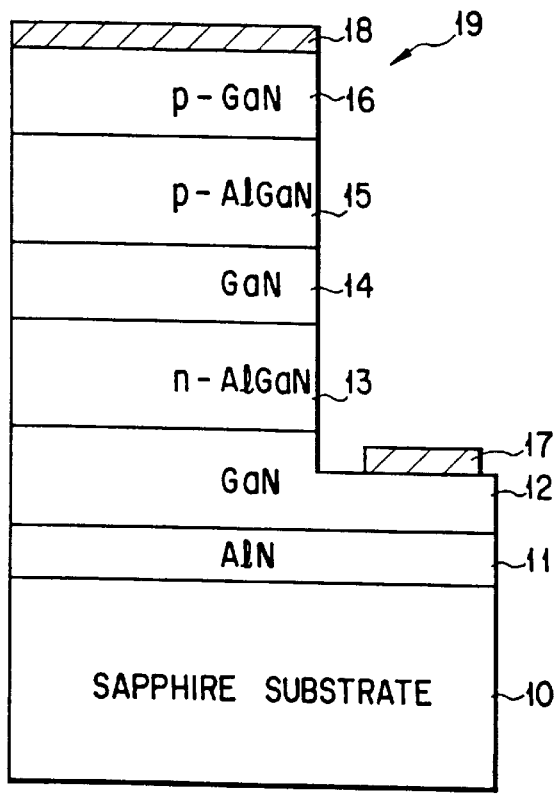
F I G. 2

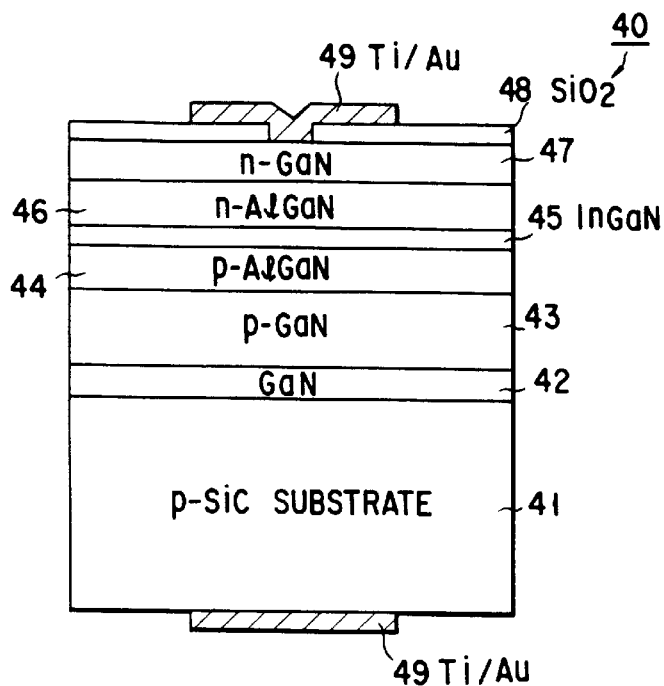
F I G. 4
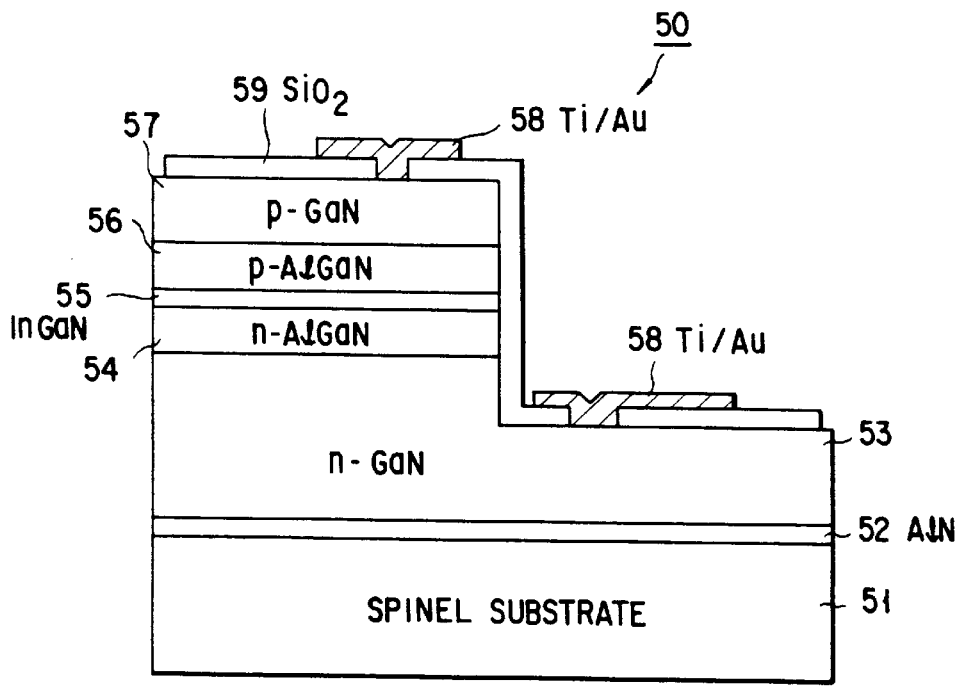
F I G. 5

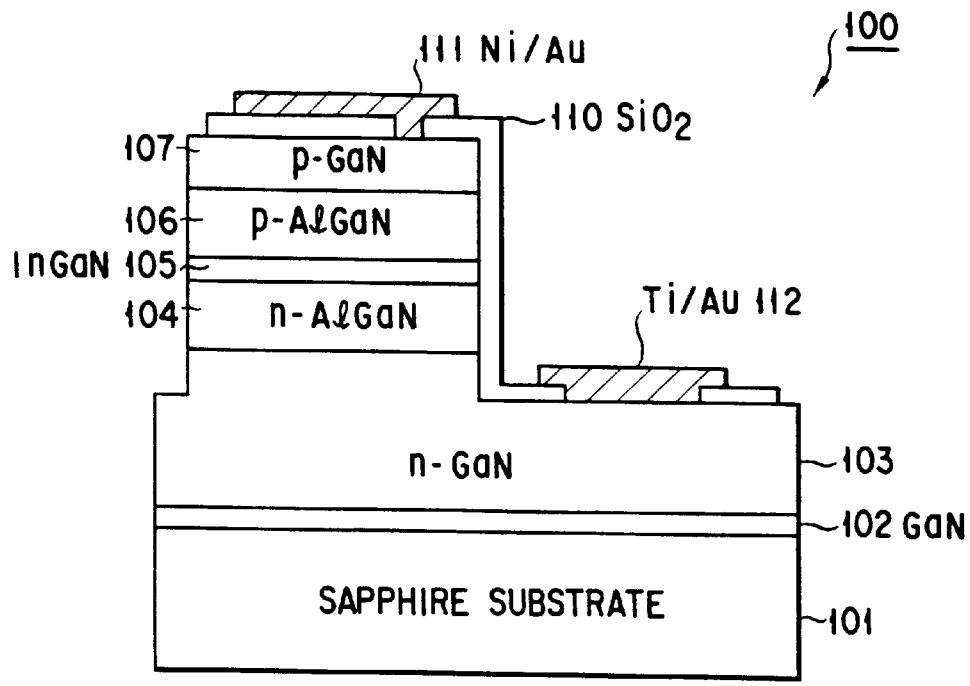
F I G. 9
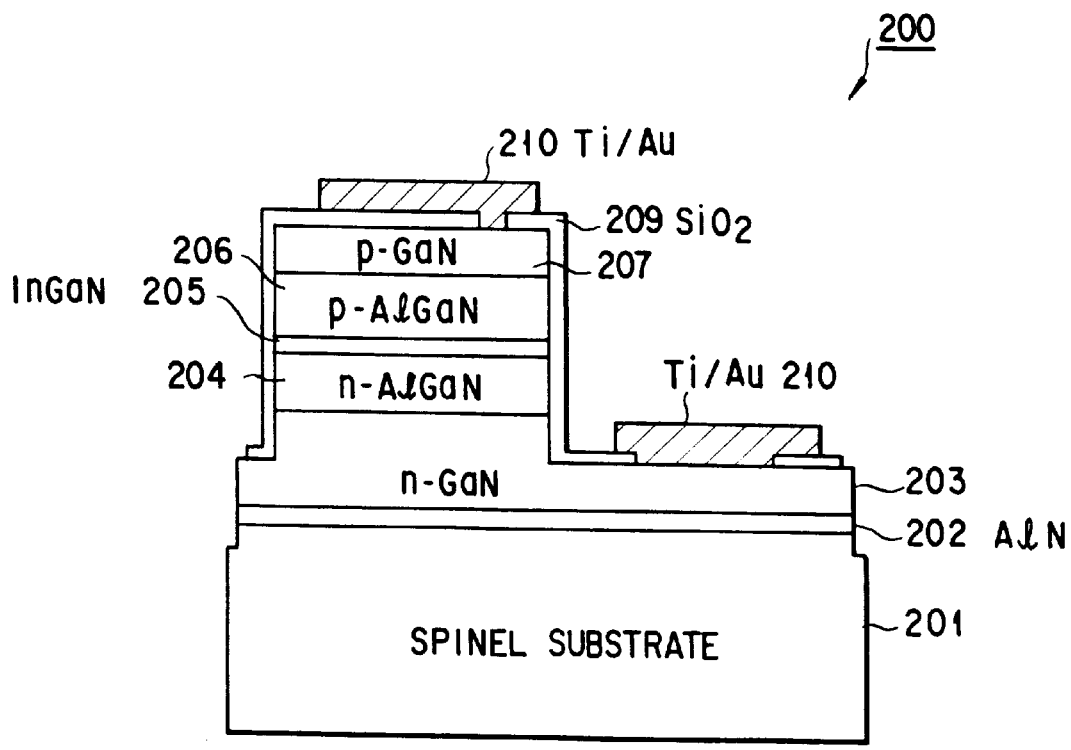
F I G. 10

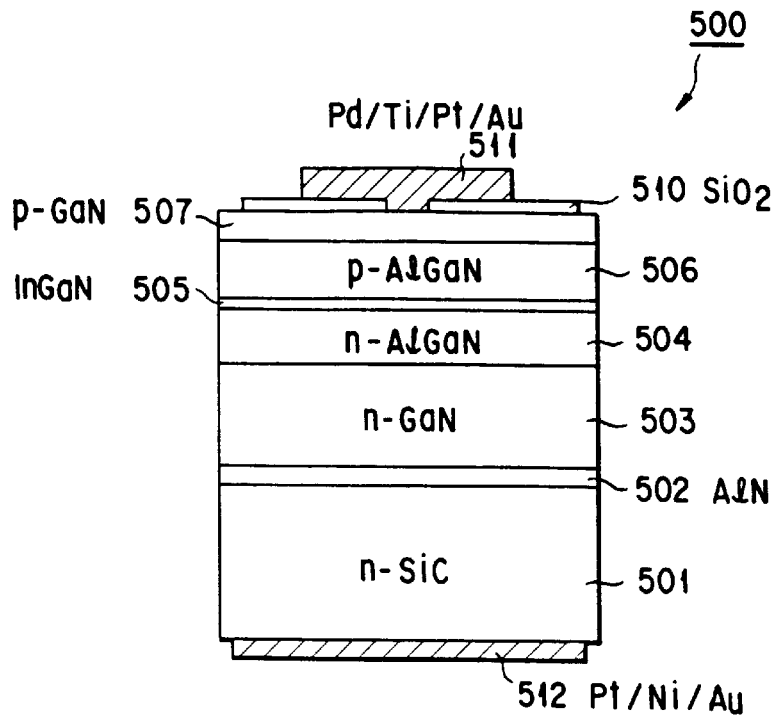
F I G. 12
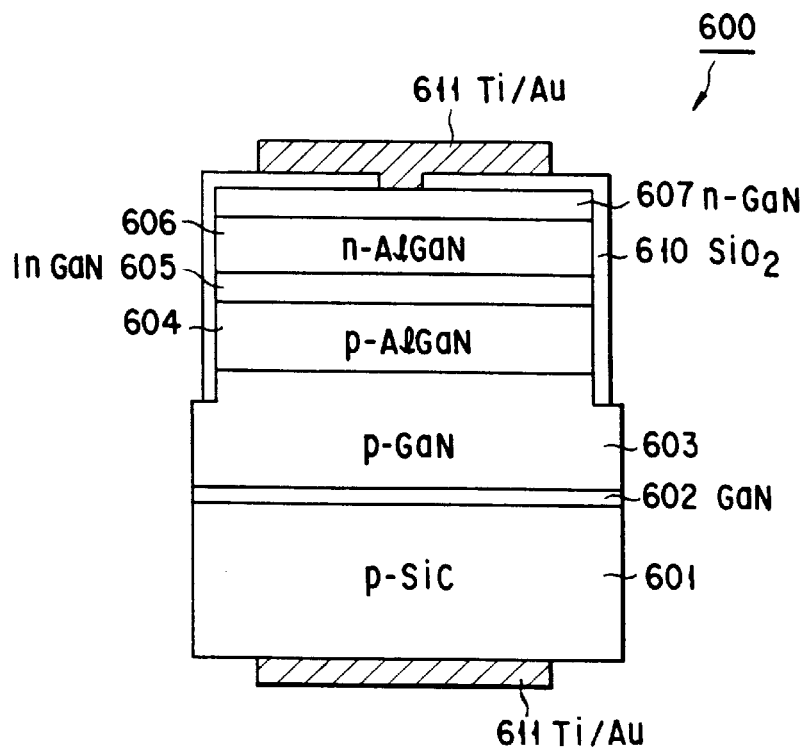
F I G. 13

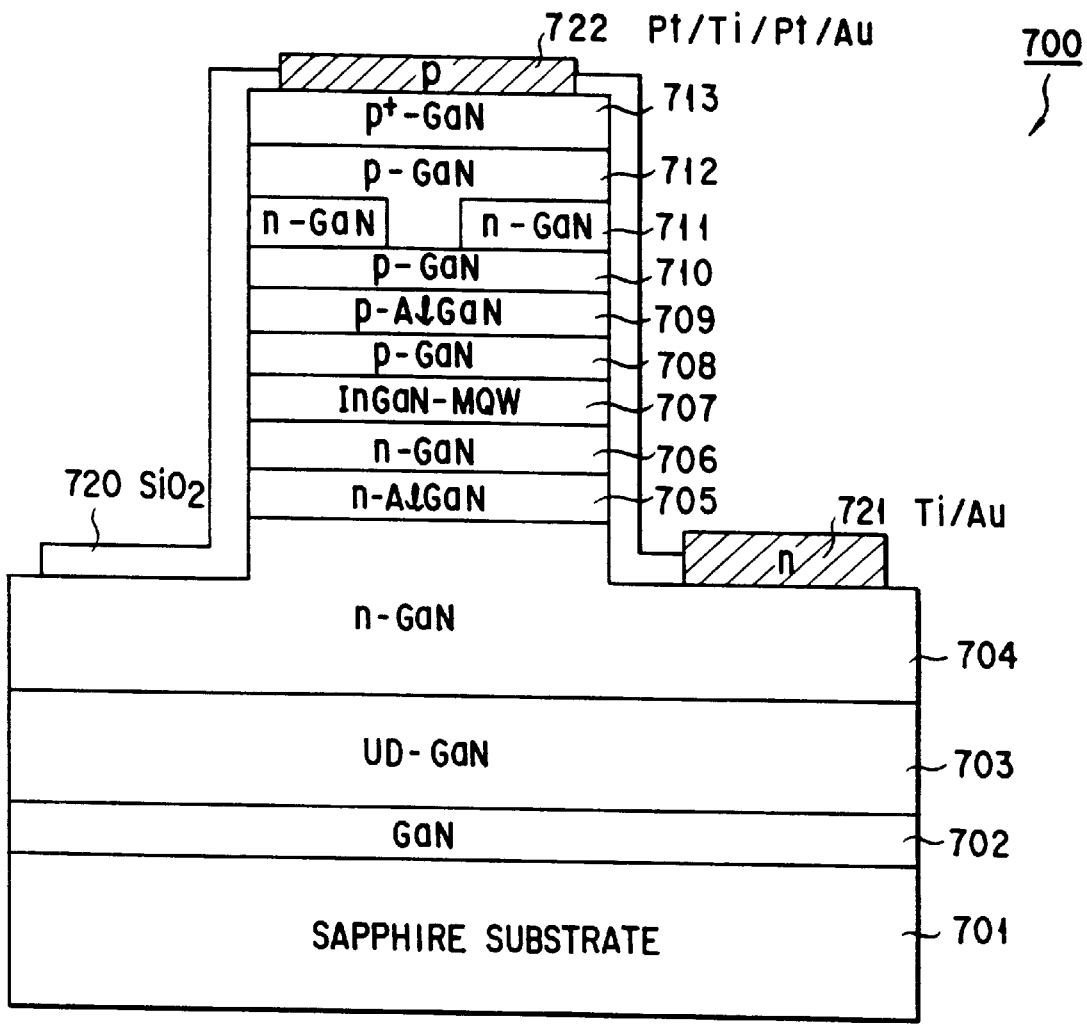
F I G. 14

SEMICONDUCTOR LIGHT-EMITTING DIODE HAVING A P-TYPE SEMICONDUCTOR LAYER FORMED ON A LIGHT-EMITTING LAYER

CROSS-REFERENCE TO RELATED APPLICATIONS

This application is a continuation of application Ser. No. 08/767,673 filed on Dec. 17, 1996, now U.S. Pat. No. 5,740,192 which is a continuation-in-part of application Ser. No. 08/567,982, filed Dec. 11, 1995, now U.S. Pat. No. 5,617,438.

BACKGROUND OF THE INVENTION

This invention relates to a semiconductor laser and to a semiconductor light-emitting element. In particular, this invention relates to a semiconductor laser provided with a p-type semiconductor film and a p-type layer and also to a semiconductor light-emitting element provided with a p-type semiconductor film and a p-type layer.

In recent years, a III–V Group compound semiconductor, such as GaAs, InP and GaInAlP, can be grown, by a metal organic chemical vapor deposition (MOCVD), with better controllability and has been extensively utilized as a constituent component for a semiconductor laser and a light-emitting diode.

In the MOCVD method, Zn is generally used as a p-type dopant for the III–V Group compound semiconductor and, being used as a p-type dopant for the GaAs, exhibits a substantially good doping characteristic. If, however, Zn is used as a dopant for a p-type containing III–V Group compound semiconductor, such as InP and GaInAlP, the quantity of Zn that can be incorporated into the compound semiconductor is limited and it has been difficult to dope Zn in a desired amount. Further, the activation degree of Zn is low and the diffusion of it in a layer is fast, resulting in poor controllability.

The elements Be and Mg for example may be considered as a p-type dopant in place of Zn. The element Be exhibits a good characteristic as a p-type dopant in a molecular beam epitaxy (MBE) method.

However, the organic Be compound is strongly toxic and it is very difficult to use it as the dopant in the MOCVD method. On the other hand, a straight chain type organometallic compound of Mg, such as dimethylmagnesium and diethylmagnesium, is not toxic in nature, but very strong in its self-association and never occurs in single form. For this reason, the Mg-containing straight chain type organometallic compound is not suitable as a doping agent.

Recently, biscyclopentadienylmagnesium ($Cp_2Mg$) relatively high in vapor pressure has been used as a Mg-doping material. However, the material $Cp_2Mg$ is deposited as a residual one in a crystal growing apparatus and exhibits a memory effect so that the doping control is very difficult. In spite of the fact that a three-orders-of-magnitude-greater concentration variation is required in a 0.1 $\mu$m film thickness for a double heterostructure (DH) laser device, such a sharp concentration variation cannot be ensured at the present time. In order to enhance the vapor pressure, the methyl group-attached cyclopentane ring material "bismethylcyclopentadienyl magnesium" [$(CH_3)Cp_2Mg$] is known as one example of a dopant and, even in this case, no sharp Mg-concentration variation is obtained at a doped-to-undoped interface.

In order to reduce a resistivity of a predetermined semiconductor layer, more amount of Mg has to be doped as a p-type dopant. In order to obtain a resistance value of, for example, about 0.5 $\Omega$.cm to 10 $\Omega$.cm, the Mg has to be doped at a concentration amount of about $5 \times 10^{18}/cm^3$ to $5 \times 10^{19}/cm^3$. In the case where more amount of Mg is so doped, the laser performance is lowered and, for the case of a semiconductor laser having an active layer as narrow as below 5 nm in thickness in particular, a greater adverse influence is exerted over an operating current.

In the case where the Mg doping amount is increased so as to lower the resistance of a p-type cladding layer, a semiconductor laser principally composed of a Mg-doped III–V Group semiconductor is lower in the characteristics, such as an efficiency of an emitting layer and, in the worst case, the operation is not possible.

In either case, if the Mg amount is increased in a semiconductor layer, the semiconductor laser becomes poor in its characteristics, thus failing to obtain adequate reliability.

By the way, a nitride compound semiconductor such as GaN has been attracting attention nowadays as a material for a blue light-emitting diode or for a semiconductor laser. For example, a blue light-emitting diode and a semiconductor laser have been realized by making use of the nitride compound semiconductor. This element is featured as being formed of a so-called double hetero-structure wherein a light-emitting layer is sandwiched by a pair of materials, one of which having a p-type conductivity and the other having an n-type conductivity. In this case, the energy band gaps of the p-type and n-type materials are larger than that of the light-emitting layer. It is required however in the formation of a p-type nitride compound semiconductor layer to undergo a step of electron ray irradiation or of thermal annealing after the p-type nitride compound semiconductor layer has been grown by way of an MOCVD as described for instance in Japanese Patent Unexamined Publication H/2-257679 or Japanese Patent Unexamined Publication H/5-183189. However, these steps may bring about a cause for generating a crystal defect such as a nitrogen void which is peculiar to a nitride compound semiconductor. Due to these reasons, even though the formation of a p-type nitride compound semiconductor layer has been realized, it is still impossible to increase the concentration of p-type carrier, and hence to lower the resistance of element as well as to lower the contact resistance of electrodes.

As explained above, the conventional process of manufacturing a p-type compound semiconductor layer is involved with a phenomenon which interferes with the aim of the p-type compound semiconductor. Further, it has been difficult according to the conventional method to form a p-type nitride compound semiconductor layer having a high carrier concentration.

BRIEF SUMMARY OF THE INVENTION

Accordingly, an object of the present invention is to provide a compound semiconductor layer having a p-type compound semiconductor layer of high carrier concentration.

Another object of this invention is to provide a semiconductor light-emitting element having a p-type compound semiconductor layer of high carrier concentration.

Namely, according to the present invention, there is provided a semiconductor laser exhibiting an oscillation wavelength of 450 nm or less and comprising:

a substrate;

a lower clad layer formed on or above the substrate and mainly composed of a III–V Group compound semiconductor;

an active layer formed directly on the lower clad layer and mainly composed of a III–V Group compound semiconductor; and an upper p-type clad layer formed directly on the active layer and mainly composed of a III–V Group compound semiconductor;

the upper p-type clad layer containing Mg, Si and one or more impurities for compensating residual donors.

According to the present invention, there is further provided a semiconductor laser exhibiting an oscillation wavelength of 450 nm or less and comprising:

a substrate;

a lower clad layer formed on or above the substrate and mainly composed of a III–V Group compound semiconductor;

an active layer formed directly on the lower clad layer and mainly composed of a III–V Group compound semiconductor; and an upper p-type clad layer formed directly on the active layer and mainly composed of a III–V Group compound semiconductor;

the upper p-type clad layer containing Mg and one or more acceptor impurities for compensating residual donors.

According to the present invention, there is further provided a III–V Group compound semiconductor light-emitting element having a p-n junction and being capable of emitting light through a recombination of electrons and holes;

the p-type layer containing Mg and C as an acceptor impurity for compensating residual donors, the concentration of the carbon atom being $8 \times 10^{17}/cm^3$ or more.

According to the present invention, there is further provided a semiconductor light-emitting element comprising:

a substrate comprising a p-type compound semiconductor;

a p-type GaN-based semiconductor layer formed on or above the p-type compound semiconductor substrate;

a light-emitting layer formed directly on the p-type GaN-based semiconductor layer and composed of a GaN-based semiconductor; and an n-type GaN-based semiconductor layer formed directly on the light-emitting layer;

the p-type GaN-based semiconductor layer containing Mg, Si and one or more impurities for compensating residual donors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a view showing a relation of a Mg concentration profile to a depth direction when Mg is doped into GaN layer;

FIG. 2 is a cross-sectional view showing a semiconductor laser according to one embodiment of the present invention;

FIG. 4 is a cross-sectional view of a semiconductor laser according to another embodiment of this invention;

FIG. 5 is a cross-sectional view of a semiconductor laser according to still another embodiment of this invention;

FIG. 9 is a cross-sectional view of a semiconductor laser according to still another embodiment of this invention;

FIG. 10 is a cross-sectional view of a semiconductor laser according to still another embodiment of this invention;

FIG. 12 is a cross-sectional view of a semiconductor laser according to still another embodiment of this invention;

FIG. 13 is a cross-sectional view of a semiconductor laser according to still another embodiment of this invention;

FIG. 14 is a cross-sectional view of a semiconductor laser according to still another embodiment of this invention.

DETAILED DESCRIPTION OF THE INVENTION

Figure 3:
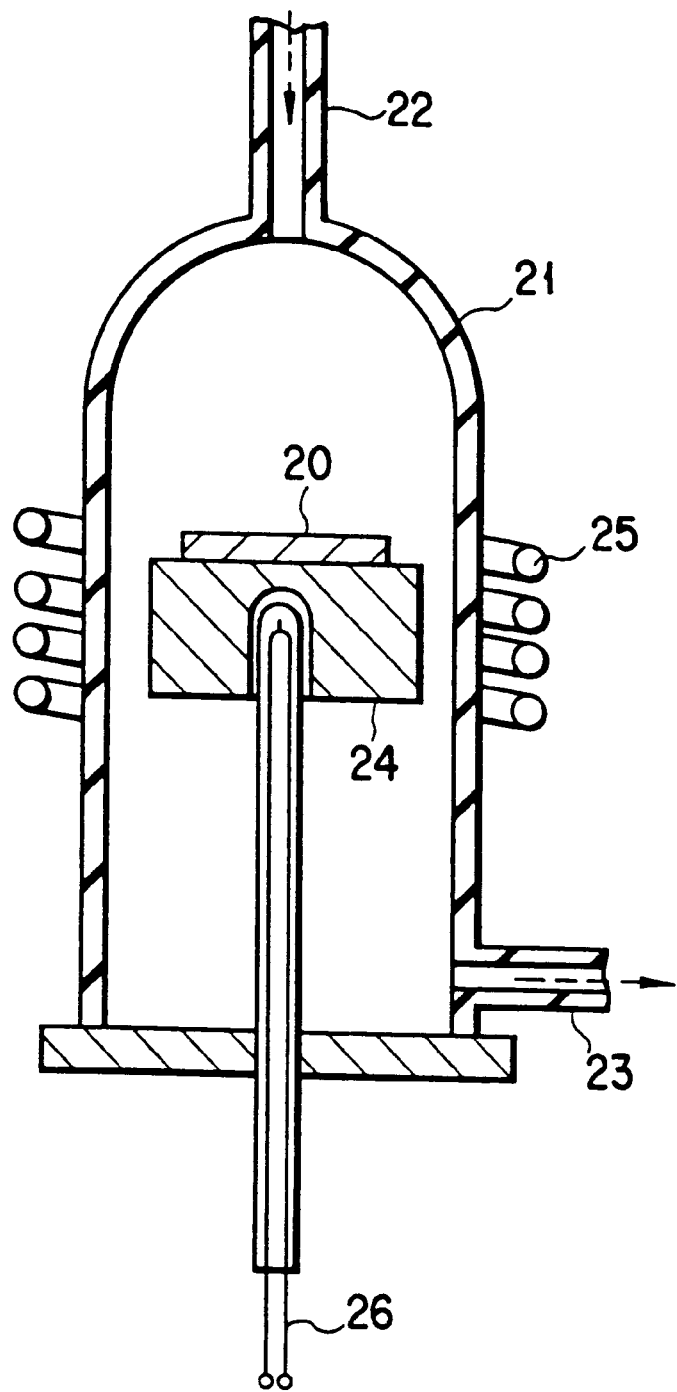
FIG. 3 is a diagrammatic view showing a crystal growing apparatus as used in the manufacture of the embodiment.

The inventors have conceived that the lowering in reliability of a semiconductor laser that will be caused by the doping of a greater quantity of Mg into a III–V Group compound semiconductor layer is due to the diffusion of Mg into an associated layer and no formation of any sharp interface between a doped and an undoped layer. As a result of strenuous researches into the causes, the inventors have found it possible to suppress the diffusion of the Mg in the presence of Si in the doped layer. That is, in order to reduce the resistance of a specific semiconductor layer to nearly a predetermined extent, it is required that an amount of Mg contained in that layer be set to be of the order of not less than $10^{18}/cm^3$. In this case, the Mg is diffused across an interface with an adjacent layer. For this reason, no sharp interface is created between the doped and the undoped layer, resulting in lowered reliability being caused on a semiconductor laser.

In the semiconductor laser of the present invention, Si together with Mg is present in a p-doped layer so that the diffusion of Mg in the p-doped layer can be suppressed. Particularly by incorporating the amount of Si corresponding to that of Mg into the doped layer it is possible to more effectively suppress the diffusion of Mg. Where not less than $2 \times 10^{17}/cm^3$ of Si is contained in a III–V Group compound semiconductor layer, even if not less than $5 \times 10^{18}/cm^3$ of Mg is contained in this layer, the diffusion of Mg into a neighboring layer is suppressed. That is, a desired resistance is obtained by doping a larger amount of Mg and, by suppressing the diffusion of Mg by Si, it is possible to ensure a sharp interface between the doped and the undoped layer. With the employment of a semiconductor laser having such semiconductor components as main constituents, it is possible to prevent the semiconductor laser from being lowered in reliability.

According to the present invention, if Mg is doped as a p-type dopant into the III–V Group compound semiconductor, two kinds of gases can be used as feed gases, one being a compound gas containing the Si and the other a compound gas containing the Mg. As the compound gas containing the Si, use may be made of an Si hydride such as $SiH_4$ and $Si_2H_6$ as well as an organometallic Si component such as $Si(CH_3)_4$, while, on the other hand, as the compound gas containing the Mg use may be made of $CP_2Mg$, bis(methylcyclopentadienyl) magnesium, bis(ethylcyclopentadienyl) magnesium, etc.

The flow rate of the feed gas containing the Si can be determined in accordance with that of the feed gas containing the Mg. Since the amount of Si corresponding to that of Mg needs to be present so as to suppress the diffusion of the Mg in the III–V Group compound semiconductor layer, an amount of Si fed is selected in accordance with a desired amount of Mg. If, for example, the amount of carrier flow through $CP_2Mg$ at 0° C. is fed as the Mg feed at a rate of 10 to 100 cc/min., then the amount of $SiH_4$ is also fed as the Si feed, preferably, at a rate of 10 to 100 cc/min. with a concentration of 10 ppm.

In the manufacture of a semiconductor laser of the present invention having a predetermined compound semiconductor layer containing the Si and Mg, use may be made, as a feed gas, of a compound containing the Mg and Si. Effective as such a compound is an organic Mg compound having a bond with three methyl groups attached to an Si atom as represented by an $Me_3Si$ group.

Explanation will be given below about the organic Mg compound. The organic Mg compound contains the Mg and Si and hence only one kind of feed gas is required and, in addition, the following advantages are also obtained. The inventors have considered a $Cp_2Mg$ memory effect not as being an essential problem of the Mg compound but as being a problem specific to the Mg compound containing a cyclopentane ring. It is, therefore, possible to avoid the memory effect if the Mg compound free from any cyclopentane ring is used as the feed gas. However, a straight-chain type alkyl Mg compound, being normally used as a feed gas in an MOCVD process, exhibits a strong self-associative property as set out above and does not occur in single form.

The inventors have found that, of the organic Mg compounds, those having a bulkier and well-symmetrical group occur as a single form and as a compound having an adequately high vapor pressure. The material $[(Me_3Si)_2N]_2Mg$ is considered as one of such compounds and can ensure an adequate vapor pressure because its melting point is 116° C. Therefore, the material $[(Me_3Si)_2N]_2Mg$ is particularly preferable as a p-type dopant.

This Mg compound has a structure represented by the following formula (1).

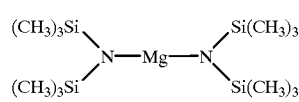

(1)

This compound exhibits a marked advantage as a doping material when Mg is doped in the III–V Group compound semiconductor containing N. It is generally considered that, if Mg is doped in the III–V Group compound semiconductor with N contained therein, hydrogen (H) together with Mg is incorporated into the semiconductor. With hydrogen mixed into a doping layer, the activation degree of the p-type dopant is lowered and it is therefore possible to minimize the mixing of H into the doping layer. The compound represented by the formula (1) above has a Mg—N bond in its own structure and it is possible to suppress the mixing of H in the doped layer and hence to achieve the effective doping of Mg. The trimethylsilyl group in the compound above is of such a type as to have three methyl groups attached to an Si atom and hence is bulkier, steric and well symmetrical. For this reason, the $Me_3Si$-group, combining with another substance, produces a stable substance.

By forming a p-type cladding layer of the III–V Group compound semiconductor by the MOCVD method with the use of such an organic Mg compound as a feed gas, Si together with Mg is incorporated in the doping layer. This Si suppresses the Mg diffusion whereby a sharp interface is created between the doped and the undoped layer.

Since the organic Mg compound has an adequate high vapor pressure and no memory effect, the sharpness of the doped-to-undoped layer interface can be more enhanced and hence doping can be achieved with good reproducibility.

It is considered that the incorporation of Si into the compound semiconductor as set out above occurs even if use is made of two kinds of feed gases, one containing Si and the other containing Mg.

That is, a highly reliable semiconductor laser can be obtained by incorporating Si into a cladding layer of the p-doped III–V Group compound semiconductor layer.

The present invention will be explained below by way of examples.

EXAMPLE I

Using the material $[(Me_3Si)_2N]_2Mg$ as a feed gas, Mg was doped into a GaN layer by virtue of an MOCVD method and measurement was made by an SIMS analytical method on a Mg concentration profile in a depth direction of the GaN layer. A result of measurement is shown in FIG. 1. For comparison, Mg was doped into a GaN layer with the use of the material $Cp_2Mg$ and then measurement was similarly made on the Mg concentration profile, the result of which being shown in FIG. 1.

As shown in FIG. 1, when the material $Cp_2Mg$ was used as the feed gas, Mg was not immediately incorporated into a desired layer even if the feed gas starts flowing. Further, Mg was slowly taken into that layer even if the supply of Mg was stopped.

When, on the other hand, the material $[(Me_3Si)_2N]_2Mg$ was used, Mg was doped substantially at a constant rate into the doped layer while leaving a somewhat tail curve at a rise and a fall in the level of Mg.

It is to be noted that, in the case of $[(Me_3Si)_2N]_2Mg$, Si together with Mg was incorporated into the doping layer in substantially the same amount and that the concentration profile was sufficiently sharp.

As evident from FIG. 1, a sharp interface is created between a doped layer and an undoped layer by allowing Si, together with Mg, to be incorporated into the doped layer.

FIG. 2 is a cross-sectional view showing a semiconductor laser according to a first embodiment of the invention. A first buffer layer 11 of AlN (10 nm), a second buffer layer 12 of GaN (1.0 μm), an Si-doped n-type cladding layer 13 of AlGaN (1.0 μm), an active layer 14 of GaN (0.05 μm), an Mg-doped p-type cladding layer 15 of AlGaN (1.0 μm) and an Mg-doped p-type contact layer 16 of GaN (0.5 μm) are formed over the surface of a sapphire substrate 10 in a sequential way. Further, an Au/TiAl electrode 17 and Au/Ni electrode 18 are provided on the upper surface of the second buffer layer 12 and p-type contact layer 16, respectively.

FIG. 3 is a diagrammatical view showing a crystal growing apparatus using a method for carrying out the present invention. Reference numeral 21 in FIG. 3 shows a reaction tube made of quartz. A feed gas mixture is introduced via a gas supply inlet 224 into the reaction tube 21. The gas mixture in the reaction tube 21 is exhausted via a gas exhaust outlet 23. A susceptor 24 made of carbon is located in the reaction tube 21 and dielectrically heated by a high frequency coil 25. A sample substrate 20 is placed on the susceptor 24 and the temperature of the substrate 20 is measured by a thermocouple 26 and the measured temperature is controlled by another device, not shown.

A method of manufacturing a semiconductor laser of a structure as shown in FIG. 2 will be briefly explained below with the use of the growth device of FIG. 3.

First, a substrate is placed on the susceptor and, through the introduction of an $H_2$ gas into a chamber, heated to 1100° C. and the surface of the substrate is cleaned. Then, the substrate temperature is dropped to 450 to 900° C., followed by the replacement of the $H_2$ gas with an N-containing organic compound, such as an $NH_3$ gas or $(CH_3)_2N_2H_2$. Together with the N-containing organic compound, an organometallic compound corresponding to layers to be grown is introduced into the chamber and respective layers are grown over the substrate surface.

In the formation of semiconductor layers on the substrate, an organometallic Al compound, such as $Al(CH_3)_3$ or $Al(C_2H_5)_3$, is introduced into the chamber to form a first buffer 11 containing AlN on the substrate 10.

Then, an organometallic Ga compound, such as $Ga(CH_3)_3$ or $Ga(C_2H_5)_3$, is introduced into the chamber to form a second buffer layer 12 containing GaN.

A first cladding layer 13 containing AlGaN is grown on the surface by introducing an n-type doping feed in addition to the organometallic Al compound and organometallic Ga compound. As the n-type doping feed use can be made of an organometallic Si compound, such as an Si hydride such as $SiH_4$ or organometallic Si compound such as $Si(CH_3)_4$.

An active layer 14 is grown on the resultant surface, like the second buffer layer, by introducing the organometallic Ga compound such as $Ga(CH_3)_3$ or $Ga(C_2H_5)_3$ into the chamber. It is to be noted that In may be added to the GaN active layer 14 so as to narrow a band gap in the GaN active layer 14. In this case, In can be added to the active layer by introducing an organometallic In compound such as $In(CH_3)_3$ or $In(C_2H_5)_3$ at a molecular ratio of In source to Ga source in vapor phase of 5% to 100% for example.

A cladding layer 15 containing AlGaN is grown on the resultant surface by introducing a p-type doping feed in addition to the organometallic Al compound and organometallic Ga compound. As a p-type doping feed, use can be made of a trimethylsilyl group-containing organometallic Mg compound such as $[(Me_3Si)_2N]_2Mg$, $[(Me_3Si)CH_3]_2Mg$ and $(Me_3Si)_2Mg$.

A contact layer 16 is grown on the resultant surface by introducing the organometallic Ga compound such as $Ga(CH_3)_3$ or $Ga(C_2H_5)_3$ into the chamber. As the p-type doping feed for the contact layer 16, use is made of the trimethylsilyl group-containing organic Mg compound.

In this way, the first buffer layer, the second buffer layer, the first cladding layer, the active layer, the second cladding layer and the contact layer are sequentially formed over the semiconductor substrate as set out above and a resultant semiconductor structure is selectively etched to remove predetermined areas.

An Au/TiAl electrode 17 is formed by vapor deposition on the exposed surface of the second buffer layer 12 and an Au/Ni electrode 18 is by vapor deposition on the surface of the contact layer 16 to obtain a semiconductor laser 19 of the present invention as shown in FIG. 2. The semiconductor laser of such an arrangement has an oscillation wavelength of 450 nm.

Consideration is given below about the concentration of Mg and Si in the p-doped layer in the semiconductor laser of the first embodiment. It is considered that, if a 1.0 μm-thick p-doped layer is formed in accordance with the above-mentioned process step with the flow rate of the Mg feed at 0° C. with 50 cc/min., an amount of Mg and of Si in the p-type cladding layer is $5\times10^{20}/cm^3$ and $3\times10^{19}/cm^3$, respectively. In this case, an amount of Mg in a 1.0 μn-film thickness varies by three-orders-of-magnitude at a boundary between the p-type cladding layer and the active layer.

Even where the active layer (undoped layer) underlying the doped layer is not more than 5 nm thick, the doping amount can be controlled with adequate accuracy.

Calculation was made on the amount of Mg and of Si in the p-doped layer and variation of the Mg amount at the interface between the p-doped and the undoped layer, the results of which being shown in Table 1 below.

TABLE 1

| Sample No. | Si concentration | Mg concentration | Change in Mg concentration |
|---|---|---|---|
| 1 | $3 \times 10^{17}$ | $6 \times 10^{19}$ | 2 times |
| 2 | $3 \times 10^{17}$ | $5 \times 10^{18}$ | 5 times |
| 3 | $1 \times 10^{18}$ | $2 \times 10^{19}$ | 5 times |

As shown in Table 1, when an amount of Si in the p-doped layer is less than $2\times10^{17}/cm^3$, a variation in an Mg amount per 0.1 μm in its interface with the undoped layer is only a half. That is, it is not possible to obtain a sharp doping of Mg in the p-type cladding layer.

When an amount of Mg in the p-doped layer is less than $5\times10^{18}/cm^3$, a desired resistance cannot be obtained though a diffusion length is not more than 0.1 μm. In order to maintain the characteristic of the doped layer, a concentration equal to or more than $1\times10^{19}/cm^3$ of Mg is required. If, on the other hand, Si is contained in the doped layer, Mg is diffused to a neighboring layer, thus failing to obtain any sharp interface.

Where Si in the p-doped layer is equal to or more than $2\times10^{17}/cm^3$, a variation in an amount of doped Mg at the interface with the undoped layer is five times per 0.1 μm. From this, it has been found possible to obtain a very sharp interface. Even in this case, the resistance of the p-doped layer is not more than 1 Ω.cm, a value adequate to a semiconductor laser.

Since, according to the present invention, Si is incorporated into a p-type AlGaN cladding layer of DH structure, it is possible to achieve a sharp doping of Mg and hence to predict a DH laser of excellent performance.

Since, in particular, the organic Mg compound having an $Me_3Si$-group is used as an AlGaN p-type dopant, the sharp doping of Mg can be achieved at the p-type AlGaN cladding layer of DH structure, thus making it possible to manufacture a DH laser of excellent performance.

Since, according to the present invention, not only Mg but also Si is incorporated into the AlGaN cladding layer, it is predicted that the sharp concentration change of Mg can be achieved and a DH laser of excellent performance can be obtained.

Since, in particular, the organic Mg compound having an Me$_3$Si group is used as the Mg feed, a sharp doping can be achieved at the cladding layer-to-active layer interface and at the same time the development of defects and distortion can be suppressed at the surface of the cladding layer and it is possible to manufacture a DH laser of excellent performance.

The present invention is not restricted to the above-mentioned respective embodiments. Although, in the embodiment, the trimethylsilyl group-containing organic Mg compound has been used as a Mg feed gas in an MOCVD process, use can be made of any Me$_3$Si group-containing organic Mg compound.

The materials of the compound semiconductor layer as set out in connection with the embodiment are not restricted thereto and a proper modification can be made in accordance with a specification used. Various changes and modifications can be made without departing from the spirit and scope of the present invention.

According to the present invention, as set out above in more detail, a highly reliable semiconductor laser can be obtained by incorporating Mg and Si into the p-doped III–V Group compound semiconductor.

Since a Me$_3$Si-group-containing organic Mg compound is employed as the Mg material in the MOCVD process according to the method of the present invention, it is possible to ensure the growth of a compound semiconductor layer structure excellent in a doping sharpness of Mg with good reproducibility and with controllability of Mg concentration. It is expected that the present method contributes much to the improvement of the characteristic of a semiconductor laser and of a device using a compound semiconductor such as a light-emitting diode.

EXAMPLE II

The present inventors have made an extensive study on the cause of failure to obtain a p-type nitride compound semiconductor having a high carrier concentration and succeeded to obtain the following findings. Namely, it has been assumed that a p-type nitride compound semiconductor should indicate a p-type conductivity only if it is added with Mg exhibiting inherently a nature of acceptor as a dopant. However, it has been impossible with an addition only of Mg to obtain a p-type nitride compound semiconductor having a high carrier concentration because of the following two phenomena. First, since the nitride compound semiconductor is liable to generate nitrogen voids or Ga entering an interstice of lattice, a high concentration of residual donor will be resulted in the semiconductor layer of p-type. Secondly, the acceptor level of Mg of the nitride compound semiconductor is extremely deeper than the acceptor level which has been commonly considered of the semiconductor.

Therefore, it has been found that by adding, together with Mg, one or more impurities which is ordinary irrelevant to the conversion to p-type or an acceptor impurity to an nitride compound semiconductor, the donor formed due to the nitrogen void can be compensated. Namely, since it is possible with the addition of such an impurity to remove any cause that has been an obstacle in the conversion of a semiconductor to a p-type semiconductor by making use of Mg, the formation of a p-type crystal having a high carrier concentration has become possible by the addition of Mg.

As for an impurity for compensating the residual impurities and for realizing a crystal of high carrier concentration or as for an acceptor impurity, an impurity which is deep in terms of energy is preferable for use. By the employment of such an impurity, the capture cross section of the crystal can be enlarged and a large quantity of residual donors can be compensated with an addition of small amount of the impurity.

EXAMPLE II-1

FIG. 4 illustrates a cross-sectional structure of a semiconductor laser 40 according to this invention. The laser 40 comprises a p-type SiC substrate 41 on which a GaN buffer layer 42 having a thickness of 10 nm is formed for alleviating a mismatching of lattice. On this GaN buffer layer 42 are further deposited a p-type GaN layer 43 (2 μm in thickness), a p-type AlGaN layer 44 (500 nm in thickness), an InGaN active layer 45 (100 nm in thickness), an n-type AlGaN layer 46 (500 nm in thickness) and an n-type GaN layer 47 (300 nm in thickness) in the mentioned order. Each of these layers are made into a p-type or an n-type conductivity by the addition of a suitable impurity or impurities. Specifically, the impurities added to the p-type GaN layer 43 and the p-type AlGaN layer 44 are Mg and C. On the other hand, the impurity added to the n-type AlGaN layer 46 and the n-type GaN layer 47 is Si. Among these impurities, C (carbon) in the p-type layers 43 and 44 functions to form a deep acceptor level thereby compensating the residual donors, thus making it possible to achieve an increased carrier concentration through the addition of Mg which forms a relatively shallow acceptor level.

Additionally, a Ti/Au laminate electrode 49 which is defined into a stripe 10 μm in width by the presence of an SiO$_2$ film 48 is deposited on the n-type GaN layer 47. The same kind of Ti/Au laminate electrode 49 having the same thickness as mentioned above is also formed on the back surface of the p-type SiC substrate 41.

Next, the method of manufacturing the semiconductor laser 40 will be explained as follows.

This semiconductor laser 40 was manufactured by way of the known metal organic chemical vapor deposition (MOCVD) method. The raw materials employed in this case were organometallic raw materials such as trimethylgallium (TMG), trimethylaluminum (TMA), trimethylindium (TMI) and biscyclopentadienylmagnesium (Cp$_2$Mg); and gaseous raw materials such as ammonia, silane and propane. As a carrier gas, hydrogen and nitrogen were employed.

First of all, the SiC substrate 41 was subjected to an organic washing and acid washing. Then, the resultant SiC substrate 41 was mounted on a susceptor which was placed in a reaction chamber of an MOCVD apparatus so as to be heated by means of a high-frequency wave. Then, the natural oxide film formed on the surface of the SiC substrate 41 was removed by subjecting it to a vapor-phase etching at a temperature of 1,200° C. for about 10 minutes while allowing hydrogen gas to flow at a flow rate of 20 l/min. at normal pressure.

For the formations of semiconductor layers on this SiC substrate 41, the temperature of the SiC substrate 41 was lowered down to 800° C., and hydrogen gas, nitrogen gas, ammonia gas and TMG were allowed to flow for about 5 minutes to form the GaN buffer layer 42. The flow rate of each of hydrogen gas, nitrogen gas and ammonia gas was set to 5 l/min., and the flow rate of TMG was set to 30 cc/min.

Thereafter, the SiC substrate 41 was heated up to 1,100° C. and kept at this temperature, and at the same time, hydrogen gas and nitrogen gas each being fed as a carrier gas, ammonia and propane gas each being fed as a feed gas, and TMG and Cp$_2$Mg each being fed as an organometallic raw material were allowed to flow for about 30 minutes, thereby to form the p-type GaN layer 43. In this case, the flow rate of each carrier gas was set to 5 l/min., and the flow rate of organometallic raw material was set to 30 cc/min. The flow rates of ammonia and propane were set to 5 l/min. and 10 cc/min., respectively. Then, additional TMA was allowed to flow at a flow rate of 100 cc/min. for about 8 minutes together with these gases to form the p-type AlGaN layer 44.

In the formation of the InGaN active layer 45, the temperature of the SiC substrate 41 was lowered down to 800° C. and kept at this temperature, and then nitrogen gas (10 l/min.), ammonia gas (5 l/min.), TMG (30 cc/min.) and TMI (200 cc/min.) were allowed to flow for about 10 minutes.

Thereafter, the SiC substrate 41 was again heated up to 1,100° C. and kept at this temperature, and at the same time, hydrogen gas and nitrogen gas each being fed as a carrier gas, TMG and TMA each being fed as an organometallic raw material, and ammonia gas and silane gas each being fed as a raw material gas were allowed to flow for about 8 minutes, thereby to form the n-type AlGaN layer 46. In this case, the flow rate of each carrier gas was set to 5 l/min., and the flow rates of TMG and TMA were set to 30 cc/min. and 100 cc/min., respectively. The flow rates of ammonia and silane were set to 5 l/min. and 1 cc/min., respectively. Thereafter, all of these gases except the TMA were continued to flow for about one hour to form the n-type GaN layer 47. Subsequently, the reaction chamber was cooled down to room temperature while allowing only nitrogen gas to flow at a flow rate of 10 l/min., and then the wafer having these growth layers was taken out of the reaction chamber.

Then, a SiO$_2$ film 48 was formed up to a thickness of 0.5 μm on the n-type GaN layer 47 by means of the known thermal CVD method. This SiO$_2$ film 48 was then subjected to a photoetching process to form an opening having a width of 10 μm therein. Thereafter, a Ti film 50 nm in thickness and an Au film 3 μm in thickness were successively formed on the upper surface of the opening by means of the known vacuum vapor deposition method to form the Ti/Au laminate electrode 49. Another Ti/Au laminate electrode having the same thickness as mentioned above was also formed on the back surface of the SiC substrate 41.

In this semiconductor element, carbon (C) is contained in the p-type GaN layer 43 and the p-type AlGaN layer 44 at a concentration of $1\times10^{17}$ cm$^{-3}$. This is because the concentration of carbon corresponds to the carrier concentration in the undoped GaN film. In this embodiment, although the concentration of carbon in the p-type layers was set to the above value, the concentration of carbon should not be construed to be limited to this value. Since the concentration of residual donor fluctuates depending on the conditions of growing crystals, the concentration of carbon for compensating the residual donor concentration may be suitably determined according to the conditions of growing crystals. However, in order to compensate the residual donor concentration and at the same time to avoid carbon atoms from becoming any cause for an obstacle in the p-type crystal layers, the concentration of carbon should preferably be limited to an range of from $1\times10^{16}$ cm$^{-3}$ to $1\times10^{19}$ cm$^{-3}$, more preferably to $1\times10^{18}$ cm$^{-3}$ or less.

The wafer thus manufactured was then cleaved into laser diode chips each having a size of 350 μm×500 μm. The chip thus obtained showed, though being dependent on the In-containing composition of the active layer, a continuous oscillation with a wavelength of 420 nm at room temperature.

EXAMPLE II-2

FIG. 5 illustrates a cross-sectional structure of another semiconductor laser 50 according to this invention. The laser 50 comprises a spinel substrate 51 on which an AlN buffer layer 52 having a thickness of 50 nm is formed. On this AlN buffer layer 52 are further deposited an n-type GaN layer 53 (4 μm in thickness), an n-type AlGaN layer 54 (500 nm in thickness), an InGaN active layer 55 (100 nm in thickness), a p-type AlGaN layer 56 (500 nm in thickness) and a p-type GaN layer 57 (300 nm in thickness) in the mentioned order. Each of these layers are made into a p-type or an n-type conductivity by the addition of a suitable impurity or impurities. Specifically, the impurities added to the p-type AlGaN layer 56 and the p-type GaN layer 57 are Mg and Cd. On the other hand, the impurity added to the n-type GaN layer 53 and the n-type AlGaN layer 54 is Si. Among these impurities, Cd (cadmium) in the p-type layers 56 and 57 functions to compensate the residual donors.

Additionally, a Ti/Au laminate electrode 58 which is defined into a stripe 10 μm in width by the presence of an SiO$_2$ film 59 is deposited on the p-type GaN layer 57. This Ti/Au laminate electrode 58 is composed of a laminate structure comprising a 50 nm thick Ti film and a 3 μm thick Au film. The same kind of Ti/Au laminate electrode 58 having the same thickness as mentioned above is also formed on the n-type GaN layer 53, which has been exposed by removing upper layers by means of etching.

This semiconductor laser 50 was manufactured by means of the same MOCVD method as employed in the aforementioned Example (II-1). As for the raw material for Cd to be added to the p-type layers, dimethylcadmium (DMCd) was employed. If the concentration of Cd in the p-type layers is too high, the carriers may be captured in the p-type regions thereby generating a light emission in the p-type regions, thus preventing a sufficient injection of carriers into the active layer. Accordingly, the concentration of Cd should preferably be $1\times10^{18}$ cm$^{-3}$ or less. However, if the concentration of Cd is too low, the effect expected from the addition of Cd cannot be obtained. Therefore, the concentration of Cd should preferably be $1\times10^{15}$ cm$^{-3}$ or more. When the concentration of Cd is set to a desirable range of from $1\times10^{16}$ cm$^{-3}$ to $1\times10^{17}$ cm$^{-3}$, the carrier concentration in the p-type crystal indicated a maximum.

Since the spinel employed as a substrate in this example is poor in cleavability and conductivity as compared with SiC, the threshold current becomes higher by about 20% as compared with the aforementioned Example II-1. However, since the spinel was free from a through defect which is peculiar to the SiC substrate, it was possible to enhance the output by about 30%.

EXAMPLE II-3

Figure 6:
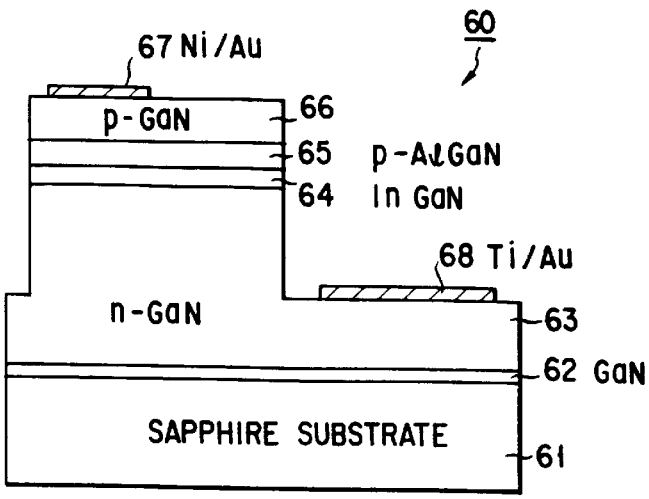
FIG. 6 is a cross-sectional view of a light-emitting diode according to another embodiment of this invention.

FIG. 6 illustrates a cross-sectional structure of a light-emitting diode 60 according to this invention. The light-emitting diode 60 comprises a sapphire substrate 61 on which a GaN buffer layer 62 (200 nm in thickness), an n-type GaN layer 63 (4 μm in thickness), an InGaN light-emitting layer 64 (100 nm in thickness), a p-type AlGaN layer 65 (300 nm in thickness) and a p-type GaN layer 66 (500 nm in thickness) are successively deposited in the mentioned order. Each of these layers are made into a p-type or an n-type conductivity by the addition of a suitable impurity or impurities. Specifically, the impurities added to the p-type AlGaN layer 65 and the p-type GaN layer 66 are Mg and Fe. On the other hand, the impurity added to the n-type GaN layer 63 is Si. Among these impurities, Fe in the p-type layers 65 and 66 functions to compensate the residual donors. Since Fe exhibits a very deep energy level, the quantity of Fe in the p-type layers may be a very small, i.e. the quantity of Fe should preferably be in the range of from $1\times10^{13}$ cm$^{-3}$ to $1\times10^{16}$ cm$^{-3}$.

Additionally, a Ni/Au laminate electrode 67 composed of a laminate structure comprising a 20 nm thick Ni film and a 1 μm thick Au film is formed on the p-type GaN layer 66. A Ti/Au laminate electrode 68 composed of a laminate structure comprising a 50 nm thick Ti film and a 2 μm thick Au film is also formed on the n-type GaN layer 63, which has been exposed by removing upper layers by means of etching.

The laminate structure of nitride compound semiconductor constituting this light-emitting diode 60 was manufactured by means of the same MOCVD method as employed in the aforementioned Example (II-1). The film thickness of each layer was controlled by adjusting the growth time, and measured by means of a scanning electron microscope (SEM). Fe which was added as an impurity for compensating the residual donors was introduced into the crystal by means of ion-implantation after the p-type AlGaN layer 65 and the p-type GaN layer 66 were epitaxially grown. Further, Zn and Si were introduced as a luminescence center into the InGaN light-emitting layer 64 by making use of dimethylzinc (DMZn) and silane as raw materials.

After this laminate structure was formed in this manner, a portion in each of the p-type GaN layer 66, the p-type AlGaN layer 65 and the InGaN light-emitting layer 64 was removed by making use of dry etching using chlorine gas so as to expose a portion of the n-type GaN layer 63, on which the n-side electrode 68 was formed. The resultant wafer was scribed to obtain a chip having a size of 350 μm square. The resultant chip was then mounted on a stem and the processes of bonding and molding were performed on this chip to obtain a light-emitting diode lamp, which was capable of emitting a light with a wavelength of 450 nm and exhibiting an output of 3 mW with a forward current of 20 mA.

Although Fe was employed as an impurity and added to the p-type layers for compensating the residual donors in this example, a small quantity of Zn to be added to the light-emitting layer as a luminescent center may be added to the p-type layers 65 and 66 so as to obtain the same effect as that of Fe. It should be noticed however that since the energy level of Zn is shallow than that of Fe, the concentration of Zn should preferably be in the range of from $1\times10^{14}$ cm$^{-3}$ to $1\times10^{17}$ cm$^{-3}$.

EXAMPLE II-4

Figure 7:
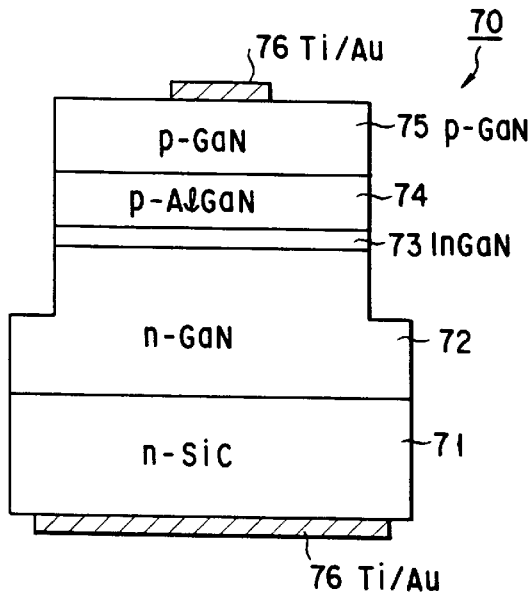
FIG. 7 is a cross-sectional view of a light-emitting diode according to another embodiment of this invention.

FIG. 7 illustrates a cross-sectional structure of a light-emitting diode 70 according to this invention. The light-emitting diode 70 comprises an n-type SiC substrate 71 on which an n-type GaN layer 72 (1 μm in thickness), an InGaN light-emitting layer 73 (100 nm in thickness), a p-type AlGaN layer 74 (300 nm in thickness) and a p-type GaN layer 75 (500 nm in thickness) are successively deposited in the mentioned order. Each of these layers are made into a p-type or an n-type conductivity by the addition of a suitable impurity or impurities. Specifically, the impurities added to the p-type AlGaN layer 74 and the p-type GaN layer 75 are Mg and Ti. On the other hand, the impurity added to the n-type GaN layer 72 is Si. Among these impurities, Ti in the p-type layers 74 and 75 functions to compensate the residual donors. In this case, Ti was introduced into the p-type layers 74 and 75 by way of vapor deposition and thermal diffusion after these p-type layers 74 and 75 were grown on the substrate.

Additionally, a Ti/Au laminate electrode 76 which is composed of a laminate structure comprising a 50 nm thick Ti film and a 2 μm thick Au film is formed on the p-type GaN layer 75. The same kind of Ti/Au laminate electrode 76 having the same thickness as mentioned above is also formed on the back surface of the n-type SiC substrate 71.

This light-emitting diode 70 was manufactured by means of a gas source MBE method using ammonia gas. Specifically, Ga metal, In metal and Al metal were respectively put in an evaporation crucible and heated therein at a predetermined temperature. Namely, the heating temperature for Ga metal was 1,050° C., the heating temperature for In metal was 750° C. and the heating temperature for Al metal was 1,060° C. The introduction of gas was performed by making use of a cracking gas cell filled therein with aluminum fibers. The gas was heated at a temperature of 500° C. and supplied in such a manner that the gas could be blown directly onto the substrate at flow rate of 5 cc/min.

First of all, the SiC substrate 71 was subjected to an organic washing and acid washing. Then, the resultant SiC substrate 71 was mounted on a susceptor and then placed in a reaction chamber. Then, the SiC substrate 71 was heated at a temperature of 900° C. for about 30 minutes and then kept at a temperature of 650° C. thereby performing the deposition of semiconductor layers on the substrate 71.

The deposition of the semiconductor layers on the substrate 71 was performed as follows. Namely, while ammonia gas was supplied via a cracking cell, at first, shutters for Ga and Si were opened thereby depositing the n-type GaN layer 72 to a film thickness of 1 μm at a growth rate of about 0.5 μm/hour, then shutters for In and Ga were opened to deposit the InGaN light-emitting layer 73, thereafter the shutters for Al, Ga and Mg were opened to deposit the AlGaN layer 74, and finally the shutters for Ga and Mg were opened to deposit the GaN layer 75.

After these films were formed, the supply of ammonia gas was suspended, and then a Ti film 300 nm in thickness was successively deposited on the GaN layer 75 by means of sputtering method in the reaction chamber. Thereafter, the temperature of reaction chamber was raised up to 1,000° C. thereby allowing Ti to be diffused into the AlGaN layer 74 and the GaN layer 75 to convert these layers to p-type layers. In this case, the magnitude diffusion of Ti into the AlGaN layer 74 and the GaN layer 75 can be controlled by controlling the film thickness of Ti film and the temperature of the heat treatment. Since the energy level of Ti is very deep, the quantity of Ti to be included in the Mg-doped GaN semiconductor may be a very little. Specifically, the concentration of Ti in the p-type layers should preferably be in the range of from $1\times10^{13}$ cm$^{-3}$ to $1\times10^{16}$ cm$^{-3}$.

An improvement in light-emitting intensity was recognized in the light-emitting diode 70 prepared in this manner as compared with the diode where Ti was not added to the p-type layers 74 and 75. Specifically, it was possible to obtain an optical output of about 5 mW with an oscillation wavelength of 430 nm.

EXAMPLE II-5

Figure 8:
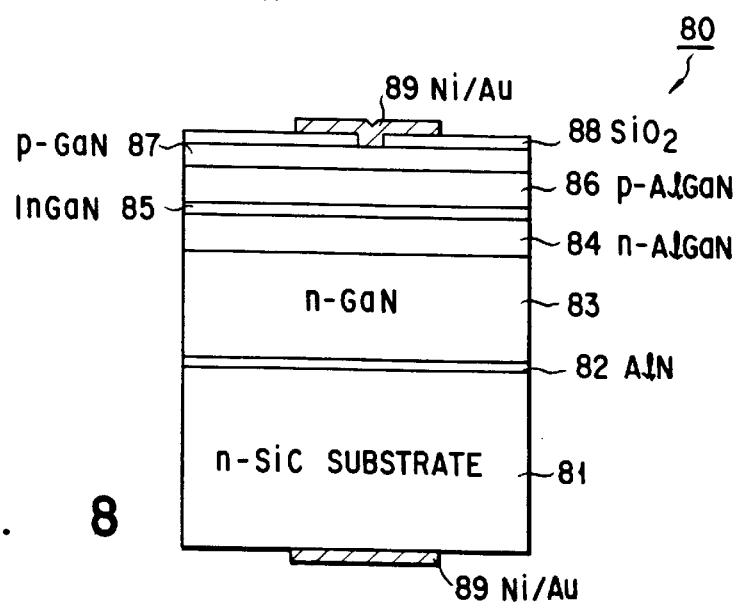
FIG. 8 is a cross-sectional view of a semiconductor laser according to still another embodiment of this invention.

FIG. 8 illustrates a cross-sectional structure of another semiconductor laser 80 according to this invention. The laser 80 comprises an n-type SiC substrate 81 on which an AlN buffer layer 82 having a thickness of 5 nm is formed for alleviating a mismatching of lattice. On this AlN buffer layer 82 are further deposited an n-type GaN layer 83 (2 μm in thickness), an n-type AlGaN layer 84 (50 nm in thickness), an InGaN active layer 85 (10 nm in thickness), a p-type AlGaN layer 86 (500 nm in thickness) and a p-type GaN layer 87 (300 nm in thickness) in the mentioned order. Each of these layers are made into a p-type or an n-type conductivity by the addition of a suitable impurity or impurities. Specifically, the impurity added to the n-type GaN layer 83 and the n-type AlGaN layer 84 is Si. On the other hand, the impurities added to the p-type AlGaN layer 86 and the p-type GaN layer 87 are Mg, C and Zn. Among these impurities, C (carbon) added to the p-type layers 86 and 87 functions to compensate the residual donors. Zn which is concurrently added to the p-type layers is also an acceptor impurity, so that the same effect that can be expected from the addition of carbon and the like impurities can be obtained from the addition of Zn. However, even if Zn was added together with Mg, it was impossible to obtain a p-type GaN-based crystal so that the effect to be expected from this invention could not be recognized. The reason for this is assumed to be ascribed to the fact that the depth in impurity level of Zn is relatively shallow as compared with other impurities.

Additionally, a Ni/Au laminate electrode 89 which is defined into a stripe 10 μm in width by the presence of an $SiO_2$ film 88 is deposited as an ohmic electrode on the p-type GaN layer 87. This Ni/Au laminate electrode 89 is composed of a laminate structure comprising a 200 nm thick Ni film and a 2 μm thick Au film. The same kind of Ni/Au laminate electrode having the same thickness as mentioned above is also formed on the back surface of the n-type SiC substrate 81.

This semiconductor laser 80 was manufactured by making use of the same raw materials and apparatus as employed in the aforementioned Example (II-1). As for the raw material for Zn to be added to the p-type layers, dimethylzinc was employed.

The wafer thus manufactured was then cleaved into laser diode chips each having a size of 350 μm×500 μm. The chip thus obtained showed, though being dependent on the In-containing composition of the active layer, a continuous oscillation with a wavelength of 410 nm and a current of 50 mA at room temperature.

EXAMPLE II-6

FIG. 9 illustrates a cross-sectional structure of another semiconductor laser 100 according to this invention. The laser 100 comprises a sapphire substrate 101 having a c-face as a principal plane, on which a GaN buffer layer 102 having a thickness of 50 nm is formed. On this GaN buffer layer 102 are further deposited an n-type GaN contact layer 103 (2 μm in thickness), an n-type AlGaN clad layer 104 (500 nm in thickness), an InGaN active layer 105 (50 nm in thickness), a p-type AlGaN clad layer 106 (500 nm in thickness) and a p-type GaN contact layer 107 (300 nm in thickness) in the mentioned order. Each of these layers are made into a p-type or an n-type conductivity by the addition of a suitable impurity or impurities. Specifically, the impurity added to the n-type GaN layer 103 and the n-type AlGaN clad layer 104 is Si. On the other hand, the impurities added to the p-type AlGaN layer 106 and the p-type GaN layer 107 are Mg, Si and C. Among these impurities, C (carbon) added to the p-type layers 106 and 107 functions to compensate the residual donors.

Additionally, a Ni/Au laminate electrode 111 which is defined into a stripe 10 μm in width by the presence of an $SiO_2$ film 110 is deposited on the p-type GaN layer 107. A Ti/Au laminate electrode 112 having a same thickness of the Ni/Au laminate electrode 111 is formed on the n-type GaN layer 103, which has been exposed by removing upper layers by means of etching.

Next, the method of manufacturing the semiconductor laser 100 will be explained as follows.

This semiconductor laser 100 was manufactured by way of the MOCVD method. The raw materials employed in this case were organometallic raw materials such as TMG, TMA, TMI and $Cp_2Mg$; and gaseous raw materials such as ammonia, $SiH_4$ and $C_3H_8$. As a carrier gas, hydrogen and nitrogen were employed.

The organometallic raw materials are not confined to the aforementioned examples, but triethylgallium (TEG) having ethyl groups instead of aforementioned methyl groups may be employed for instance. Further, methylbiscyclopentadienylmagnesium may be employed in place of the aforementioned $Cp_2Mg$.

If two kinds of gases, i.e. $SiH_4$ and $C_3H_8$ are concurrently employed as the aforementioned gaseous raw materials, both Si and C can be introduced into the p-type layers. Further, instead of employing these two kinds of gases, one kind of organic raw material containing both Si and C such as hexamethyldisilane ($(CH_3)_6Si_2$) may be employed thereby making it possible to concurrently introducing both Si and C into the p-type layers.

First of all, the sapphire substrate 101 was subjected to an organic washing and acid washing. Then, the resultant sapphire substrate 101 was mounted on a susceptor which was placed in a reaction chamber of an MOCVD apparatus so as to be heated by means of a high-frequency wave. Then, the natural oxide film formed on the surface of the sapphire substrate 101 was removed by subjecting it to a vapor-phase etching at a temperature of 1,200° C. for about 10 minutes while allowing hydrogen gas to flow at a flow rate of 20 l/min. at normal pressure.

For the formations of semiconductor layers on this sapphire substrate 101, the temperature of the sapphire substrate 101 was lowered down to 550° C., and hydrogen gas, nitrogen gas, ammonia gas and TMG were allowed to flow for about 4 minutes to form the GaN buffer layer 102. The flow rate of each of hydrogen gas, nitrogen gas and ammonia gas was set to 15 l/min., 5 l/min., 10 l/min. and 30 cc/min., respectively. Thereafter, the supply of TMG was suspended and the temperature of the substrate was raised up to 1,100° C. over 12 minutes.

Subsequently, the sapphire substrate 101 was heated up to 1,100° C. and kept at this temperature, and at the same time, hydrogen gas (15 l/min.), nitrogen gas (5 l/min.), ammonia gas (10 l/min.), TMG (100 cc/min.) and $SiH_4$ (8 cc/min.) were allowed to flow into the reaction chamber for about 60 minutes, thereby to form the n-type GaN layer 103. In this case, the $SiH_4$ gas was diluted by the addition of hydrogen gas to 10 ppm. Then, additional TMA was allowed to flow at a flow rate of 50 cc/min. for about 10 minutes together with these feed gases to form the n-type AlGaN layer 104.

In the formation of the InGaN active layer 105, the temperature of the sapphire substrate 101 was lowered down to 800° C. and kept at this temperature, and then nitrogen gas (20 l/min.), ammonia gas (10 l/min.), TMG (30 cc/min.) and TMI (200 cc/min.) were allowed to flow for about 10 minutes.

Thereafter, the sapphire substrate 101 was again heated up to 1,100° C. and kept at this temperature, and at the same time, nitrogen gas (20 l/min.), ammonia gas (10 l/min.), TMG (30 cc/min.), TMA (100 cc/min.), $Cp_2Mg$ (150 cc/min.), $SiH_4$ (1 cc/min.) and $C_3H_8$ (0.2 cc/min.) were allowed to flow for about 10 minutes, thereby to form the p-type GaN layer 106. Thereafter, all of these gases except the TMA were continued to flow for about 10 minutes to form the p-type GaN layer 107.

Si that has been added to the p-type GaN layer 106 and the p-type GaN layer 107 functions to suppress the diffusion of Mg. Further, the etching of the crystal can be facilitated by the addition of Si. If Mg is bonded with hydrogen or with oxygen, Mg is inhibited from becoming an acceptor. However, when Si is added together with Mg, such an undesirable bonding of Mg can be inhibited. However, since Si in a GaN-based semiconductor acts as a donor, the formation of a p-type semiconductor layer may be hindered if Si is added excessively. Specifically, the concentration of Si in the p-type layer should preferably be in the range of from $6 \times 10^{16}$ cm$^{-3}$ to $2 \times 10^{19}$ cm$^{-3}$. On the other hand, since carbon is required to concurrently compensate both of the Si which has been added simultaneously with carbon and the residual donors, the concentration of carbon should preferably be $1 \times 10^{16}$ cm$^{-3}$ or more.

Subsequently, the reaction chamber was cooled down to a temperature of 350° C. while allowing ammonia gas (10 l/min.) and nitrogen gas (20 l/min.) to flow therethrough. After the supply of only ammonia gas was suspended, the reaction chamber was cooled down to room temperature and then the wafer was taken out of the reaction chamber.

Then, a SiO$_2$ film 110 was formed up to a thickness of 0.5 μm on the n-type GaN layer 107 by means of the known thermal CVD method. This SiO$_2$ film 110 was then subjected to a photoetching process to form a stripe-like opening having a width of 150 μm. Thereafter, this opening where the SiO$_2$ film 110 was removed was further subjected to an etching treatment employing a chlorine gas, thereby removing the p-type GaN layer 107 in this opening portion together with the p-type AlGaN layer 106, the InGaN active layer 105 and the n-type AlGaN layer 104, thus exposing the surface of the n-type GaN layer 103.

Further, an opening having a width of 10 μm was formed in the SiO$_2$ film 110 deposited on the p-type GaN layer 107 by means of a photoetching process. Then, a Ni film 50 nm in thickness and an Au film 3 μm in thickness were successively formed on this opening by means of the known vacuum vapor deposition method to form the Ti/Au laminate electrode 111. Furthermore, a Ti film 50 nm in thickness and an Au film 3 μm in thickness were successively deposited on the n-type GaN layer 103 to form a Ti/Au laminate electrode.

As for the electrode, it is also possible, if the electrode is to be formed on the p-type layer, to employ an electrode consisting of an alloy or a laminate comprising a metal or metals selected from Pt, Pd, In, Mg and Ti, and a metal or metals selected from Ni and Au. On the other hand, if the electrode is to be formed on the n-type layer, it is possible to employ an electrode consisting of an alloy or a laminate comprising a metal or metals selected from Si and Cr, and a metal or metals selected from Ti and Au.

The wafer thus manufactured was then cleaved into laser diode chips each having a size of 350 μm×500 μm. The chip thus obtained showed, though being dependent on the In-containing composition of the active layer, a continuous oscillation with a wavelength of 420 nm and an output of 5 mW at room temperature when an electric current was passed therethrough with a current density of 5 kA/cm$^2$.

Although C (carbon) was employed as an impurity for compensating the residual donors in the aforementioned example, it is also possible to employ Zn, Cd, Ti, Ni and Fe as such an impurity. These impurities may be introduced into a layer during the crystal growth thereof by making use of an organometallic raw material such as dimethylcadmium. Alternatively, a film of these metals may be formed by means of sputtering for instance on the surface of a crystal which has been grown in advance, and subsequently the resultant film is heated so as to diffuse these metals as an impurity into the crystal. Furthermore, these metals may be introduced into a crystal which has been grown in advance by making use of an ion implantation. If this ion implantation is employed, a heat treatment should preferably be performed after the ion implantation since the ion implantation is known to cause a disorder of crystal.

The preferable range in concentration of these impurities varies depending on the kinds (of impurity. For example, in the case of Zn and Cd, an impurity concentration in the range of from $1 \times 10^{15}$ cm$^{-3}$ to $1 \times 10^{18}$ cm$^{-3}$ is preferable. In the case of Ti and Fe, an impurity concentration in the range of from $1 \times 10^{13}$ cm$^{-3}$ to $1 \times 10^{16}$ cm$^{-3}$ is preferable. In the case of Ni, an impurity concentration in the range of from $1 \times 10^{13}$ cm$^{-3}$ to $4 \times 10^{16}$ cm$^{-3}$ is preferable. Excessive addition over these upper limits of any of these impurities may prevent Mg from being activated and becoming acceptor. On the other hand, if the concentration of these impurities is less than these lower limit, the function of these impurities to compensate the residual donors can hardly be realized.

In the above examples, the MOCVD method was employed for effecting a crystal growth, a molecular beam epitaxy method (MBE method) or a source material transportation method using a chlorine gas may be employed. It is of course necessary to suitably select raw materials in the employment of these methods.

Although a GaN-based semiconductor was employed as a III–V Group compound semiconductor in the explanation of the above examples, this invention is not confined to the GaN-based semiconductor, but any suitable compound semiconductor represented by the general formula $B_xIn_yAl_zGa_{(1-x-y-z)}N$ ($0 \leq x, y, z \leq 1$) may be employed. In the case of semiconductors such as GaAs and InGaP, the concentration of Si in the p-type layer is required to be $5 \times 10^{18}$ cm$^{-3}$ or more. In this case, since the acceptor level of Mg is shallow, the formation of p-type layer was not hindered by such a degree of Si concentration as mentioned above.

In the above examples, GaN was employed as a buffer layer, but the buffer layer is not limited to GaN, but any suitable compound semiconductor represented by the general formula $Ga_xAl_yIn_zN$ (x+y+z=1) may be employed.

EXAMPLE II-7

FIG. 10 illustrates a cross-sectional structure of another semiconductor laser 200 according to this invention. The laser 200 comprises a spinel substrate 201 on which an AlN buffer layer 202 having a thickness of 50 nm is formed. On this AlN buffer layer 202 are further deposited an n-type GaN layer 203 (4 μm in thickness), an n-type AlGaN layer 204 (500 nm in thickness), an InGaN active layer 205 (100 nm in thickness), a p-type AlGaN layer 206 (500 nm in thickness) and a p-type GaN layer 207 (300 nm in thickness) in the mentioned order. Each of these layers are made into a p-type or an n-type conductivity by the addition of a suitable impurity or impurities. Specifically, the impurities added to the p-type AlGaN layer 206 and the p-type GaN layer 207 are Mg and C. On the other hand, the impurity added to the n-type GaN layer 203 and the n-type AlGaN clad layer 204 is Si.

Additionally, a Ti/Au laminate electrode 210 which is defined into a stripe 10 μm in width by the presence of an SiO$_2$ film 209 is deposited on the p-type GaN layer 207. This Ti/Au laminate electrode 210 is formed of a laminate structure comprising a 500 nm thick Ti film and 3 µm thick Au film. The same kind of Ti/Au laminate electrode having the same thickness as mentioned above is also formed on the n-type GaN layer 203, which has been exposed by removing upper layers by means of etching.

This semiconductor laser 200 was manufactured in the same manner by using the MOCVD method as in the case of Example II-6. Although hydrogen gas is generally employed as a carrier gas in the process of growing the p-type layers 206 and 207, nitrogen gas was employed in this example. Namely, by the employment of nitrogen gas as a carrier gas, carbon was introduced into the p-type layer for compensating the residual donors. It is possible to adjust the concentration in the crystal of carbon by varying the ratio between hydrogen and nitrogen in this carrier gas. For instance, when the ratio between hydrogen and nitrogen is controlled to 3:1, the concentration of carbon can be adjusted to about $2 \times 10^{18}$ cm$^{-3}$.

Although carbon exhibiting a property of acceptor was employed as an impurity for compensating the residual donors in this example, it is also possible to employ Cd for instance.

EXAMPLE II-8

Figure 11A:
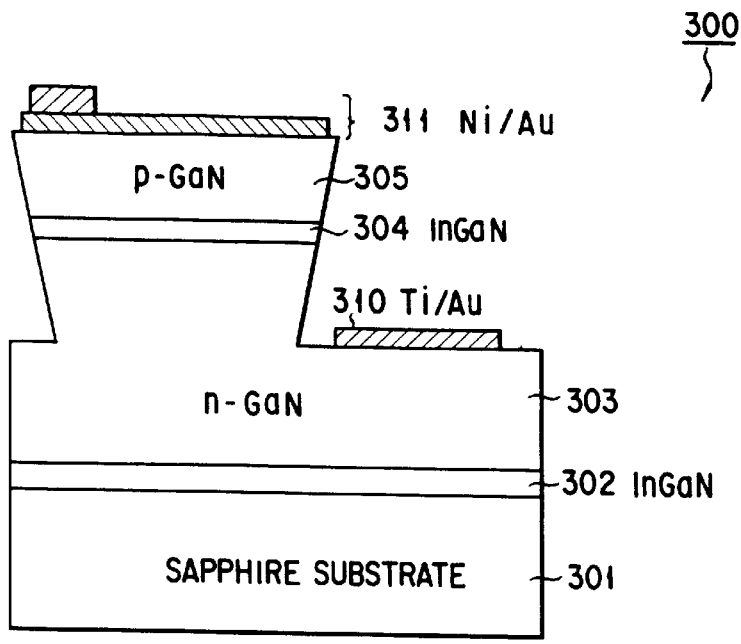
FIGS. 11A and 11B respectively shows a cross-sectional view of a light-emitting diode according to still another embodiment of this invention.

FIG. 11A illustrates a cross-sectional structure of a light-emitting diode 300 according to this invention. The light-emitting diode 300 comprises a sapphire substrate 301 on which a GaN buffer layer 302 having a thickness of 20 nm is formed. On this GaN buffer layer 302 are further formed an n-type GaN layer 303 (4 µm in thickness), an InGaN light-emitting layer 304 (100 nm in thickness) and a p-type GaN layer 305 (500 nm in thickness) are successively deposited in the mentioned order. Each of these layers are made into a p-type or an n-type conductivity by the addition of a suitable impurity or impurities. Specifically, the impurities added to the p-type GaN layer 305 are Mg as an acceptor and C for compensating the residual donors. On the other hand, the impurity added to the n-type GaN layer 303 is Si functioning as a donor. Furthermore, Zn and Si are introduced as a luminescence center into the InGaN light-emitting layer 304.

Additionally, a Ni/Au laminate electrode 311 composed of a laminate structure comprising a 20 nm thick Ni film and a 1 µm thick Au film is formed on the p-type GaN layer 305. A Ti/Au laminate electrode 310 composed of a laminate structure comprising a 50 nm thick Ti film and a 2 µm thick Au film is formed on the n-type GaN layer 303, which has been exposed by removing upper layers by means of etching.

The laminate structure of nitride compound semiconductor constituting this light-emitting diode was manufactured by means of the same MOCVD method as employed in the aforementioned Example (II-6). The film thickness of each layer was controlled by adjusting the growth time, and measured by means of a scanning electron microscope (SEM).

After this laminate structure was formed in this manner, a portion in each of the p-type GaN layer 305 and the InGaN light-emitting layer 304 was removed by making use of dry etching using chlorine gas so as to expose a portion of the n-type GaN layer 303, on which the n-side electrode 311 was formed. The resultant wafer was scribed to obtain a chip having a size of 350 µm square. The resultant chip was then mounted on a stem and the processes of bonding and molding were performed on this chip to obtain a light-emitting diode lamp, which was capable of emitting a light with a wavelength of 450 nm and exhibiting an output of 3 mW with a forward current of 20 mA.

If Si is to be employed as a luminescence center as in the case of this example, Si is more likely to be accumulated in particular on the interface of the p-type layer/the light-emitting layer, or diffused into the p-type layer. If Si is accumulated or diffused in this manner, the generation of heterobarrier or the reversion of the p-type layer into an n-type layer may be caused. These phenomena are undesirable and therefore should be avoided. In fact, such undesirable phenomena can be avoided by increasing the concentration of carbon to be added to the p-type layer. Specifically, the concentration of carbon in the p-type layer should preferably be set to $8 \times 10^{17}$ cm$^{-3}$ or more.

By the way, one of the causes for the generation of the residual donors in the p-type layer is the formation of a nitrogen void. This nitrogen void can be buried with an element such as As, O or P. However, if these elements are added individually to the p-type layer, the deterioration of energy gap or an electric inactivation may be caused. As a result, the effect to be obtained by the addition of these impurities would be lost. Therefore, these elements should desirably be added together with carbon. It is also possible to compensate the residual donors by the employment of an acceptor impurity which is capable of forming a deep level such as Cd, Fe, Ti or Ni. However, since these impurities may cause an electric inactivation if they are added individually, they should desirably be added together with carbon.

Figure 11B:
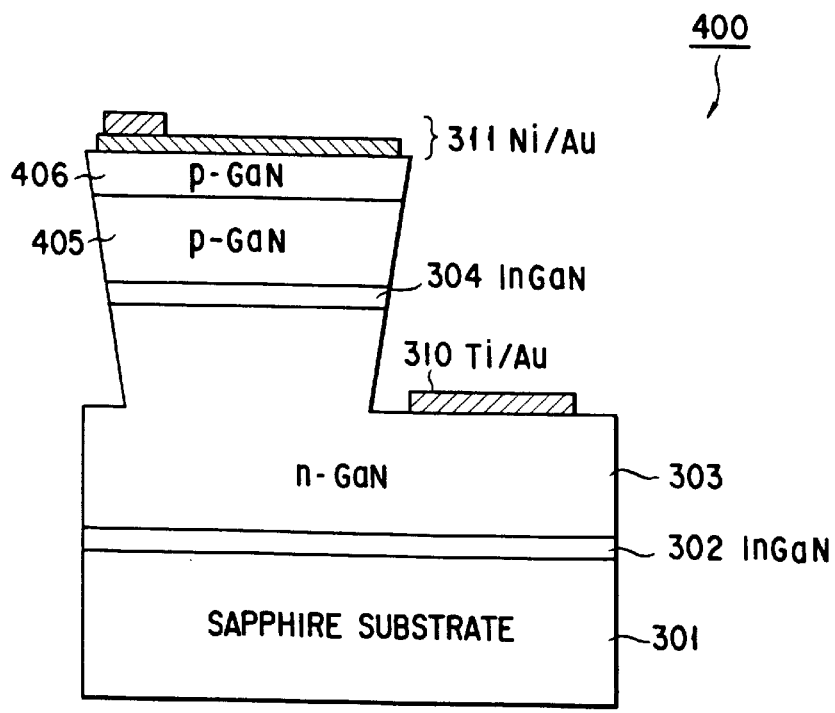

The light-emitting diode shown in FIG. 11A may be modified to such as shown in FIG. 11B. The example shown in FIG. 11B is featured in that the p-type GaN layer 305 shown in FIG. 11A is divided into two layers, i.e. a p-type GaN implantation layer 405 and a p-type contact layer 406. In this case, only Mg is added as an impurity to the GaN implantation layer 405, and Mg and C are added to the contact layer 406. It is possible with this construction to lower the resistivity of the contact layer, whereby making it possible to lower the operation voltage. To be more specific, in the case of the structure shown in FIG. 11A, the voltage at a current of 20 ma was 4V. However, in the case of the structure shown in FIG. 11B, this voltage could be lowered down to 3.5V.

Further, Si may be added to the contact layer 406. Si functions to control the diffusion of Mg or to facilitate the etching of crystal. Moreover, since Si is a IV Group element, it may be employed as an acceptor by replacing the nitrogen site with Si. For the realization of this, the layer is grown at a lower temperature than the ordinary growth temperature. Alternatively, the feeding ratio of nitrogen/III Group element may be lowered thereby making the supply of III Group element excessive as compared with the supply of nitrogen so as to inhibiting the substitution of III Group site with nitrogen. When the layer is grown in this manner, Si may be employed to function as an acceptor.

Almost the same effect can be obtained by adding As, P, O, Cd, Fe, Ti or Ni to the contact layer 406 in place of adding Si.

EXAMPLE II-9

FIG. 12 illustrates a cross-sectional structure of another semiconductor laser 500 according to this invention. The laser 500 comprises an n-type SiC substrate 501 on which an AlN buffer layer 502 having a thickness of 5 nm is formed for alleviating a mismatching of lattice. On this AlN buffer layer 502 are further deposited an n-type GaN layer 503 (2 μm in thickness), an n-type AlGaN layer 504 (500 nm in thickness), an InGaN active layer 505 (10 nm in thickness), a p-type AlGaN layer 506 (500 nm in thickness) and a p-type GaN layer 507 (300 nm in thickness) in the mentioned order. Each of these layers are made into a p-type or an n-type conductivity by the addition of a suitable impurity or impurities. Specifically, the impurity added to the n-type GaN layer 503 and the n-type AlGaN layer 504 is Si. On the other hand, the impurities added to the p-type AlGaN layer 506 and the p-type GaN layer 507 are Mg, C and Zn. Among these impurities, C (carbon) added to the p-type layers 506 and 507 functions to compensate the residual donors. Zn which is concurrently added to the p-type layers is also an acceptor impurity, so that the same effect that can be expected from the addition of the other impurities such as carbon can be obtained from the addition of Zn. However, even if Zn was added together with Mg, it was impossible to obtain a p-type GaN-based crystal so that the effect to be expected from this invention could not be recognized. The reason for this is assumed to be ascribed to the fact that the depth in impurity level of Zn is relatively shallow as compared with other impurities.

This semiconductor laser 500 was manufactured by making use of the same raw materials and apparatus as employed in the aforementioned Example (II-6). As for the raw material for Zn to be added to the p-type layers, dimethylzinc was employed.

After the crystal growth, a Pd/Ti/Pt/Au laminate electrode 511 which was defined into a stripe 10 μm in width by the presence of an SiO$_2$ film 510 was deposited as an ohmic electrode on the p-type GaN layer 507. This laminate electrode 511 was composed of a laminate structure comprising a 6 nm thick Pd film, a 50 nm thick Ti film, a 30 nm thick Pt film and a 100 nm thick Au film. On the other hand, a Pt/Ni/Au laminate electrode 512 composed of a laminate structure comprising a 50 nm thick Pt film, a 50 nm thick Ni film and a 100 nm thick Au film was also formed on the n-type SiC substrate 501.

The wafer thus manufactured was then cleaved into laser diode chips each having a size of 350 μm×500 μm. The chip thus obtained showed, though being dependent on the In-containing composition of the active layer, a continuous oscillation with a wavelength of 415 nm and a threshold current density of 5 kA/cm$^2$ at room temperature.

EXAMPLE II-10

FIG. 13 illustrates a cross-sectional structure of another semiconductor laser 600 according to this invention. The laser 600 comprises a p-type SiC substrate 601 on which a GaN buffer layer 602 having a thickness of 10 nm is formed for alleviating a mismatching of lattice. On this GaN buffer layer 602 are further deposited a p-type GaN layer 603 (2 μm in thickness), a p-type AlGaN layer 604 (500 nm in thickness), an InGaN active layer 605 of a multiple quantum well (MQW) structure comprising a 20 nm thick well layer and a 40 nm thick barrier layer, an n-type AlGaN layer 606 (500 nm in thickness) and an n-type GaN layer 607 (300 nm in thickness) in the mentioned order. Si is added to all of the GaN-based layers 602, 603, 604, 605, 606 and 607. On the other hand, Mg and C are added to the p-type GaN layer 603 and the p-type AlGaN layer 604. Among these impurities, C (carbon) added to the p-type layers 603 and 604 forms a deep acceptor level so as to function to compensate the residual donors and at the same time, assists the formation of a high carrier density through the addition of Mg which forms a relatively shallow acceptor level.

A Ti/Au laminate electrode 611 which is defined into a stripe 10 μm in width by the presence of an SiO$_2$ film 610 is deposited on the n-type GaN layer 607. This Ti/Au laminate electrode 611 is composed of a laminate structure comprising a 50 nm thick Ti film and a 2 μm thick Au film. The same kind of Ti/Au laminate electrode 611 having the same width as mentioned above is also formed on the p-type SiC substrate 601.

Next, the method of manufacturing the semiconductor laser 600 will be explained as follows.

This semiconductor laser 600 was manufactured by way of the known MOCVD method. The raw materials employed in this case were organometallic raw materials such as TMG, TMA, TMI and Cp$_2$Mg; and gaseous raw materials such as ammonia, silane and propane. As a carrier gas, hydrogen and nitrogen were employed.

First of all, the SiC substrate 601 was subjected to an organic washing and acid washing. Then, the resultant SiC substrate 601 was mounted on a susceptor which was placed in a reaction chamber of an MOCVD apparatus so as to be heated by means of a high-frequency wave. Then, the natural oxide film formed on the surface of the SiC substrate 601 was removed by subjecting it to a vapor-phase etching at a temperature of 1,200° C. for about 10 minutes while allowing hydrogen gas to flow at a flow rate of 20 l/min. at normal pressure.

For the formations of semiconductor layers on this SiC substrate 601, the temperature of the SiC substrate 601 was lowered down to 800° C., and hydrogen gas, nitrogen gas, ammonia gas, TMG and silane were allowed to flow for 5 minutes to form the GaN buffer layer 602. The flow rate of each of hydrogen gas, nitrogen gas and ammonia gas was set to 5 l/min., the flow rate of TMG was set to 30 cc/min. and the flow rate of silane was set to 0.2 cc/min.

Thereafter, the SiC substrate 601 was heated up to 1,100° C. and kept at this temperature, and at the same time, hydrogen gas and nitrogen gas each being fed as a carrier gas, ammonia, propane gas and silane each being fed as a feed gas, and TMG and Cp$_2$Mg each being fed as an organometallic raw material were allowed to flow for about 30 minutes, thereby to form the p-type GaN layer 603. In this case, the flow rate of each carrier gas was set to 5 l/min., and the flow rate of organometallic raw material was set to 30 cc/min. The flow rates of ammonia, propane gas and silane were set to 5 l/min., 10 cc/min. and 0.2 cc/min., respectively. Then, additional TMA was allowed to flow at a flow rate of 100 cc/min. for about 8 minutes together with these gases to form the p-type AlGaN layer 604.

Then, the temperature of the SiC substrate 601 was lowered down to 800° C. and kept at this temperature, and two kinds of flow rates of TMI were alternately allowed to flow while flowing nitrogen gas (10 l/min.), ammonia gas (5 l/min.), TMG (30 cc/min.) and silane (2 cc/min.) whereby forming the InGaN active layer 605 having a multiple quantum well of 25 periods. In this case, the flow of the TMI was regulated such that one-minute supply at a flow rate of 200 cc/min. and two-minute supply at a flow rate of 50 cc/min. were defined as one period, and the flow of the TMI was continued up to 25 periods.

Thereafter, the SiC substrate 601 was again heated up to 1,100° C. and kept at this temperature, and at the same time, hydrogen gas and nitrogen gas each being fed as a carrier gas, TMG and TMA each being fed as an organometallic raw material, and ammonia gas and silane gas each being fed as a raw material gas were allowed to flow for about 8 minutes, thereby to form the n-type AlGaN layer 606. In this case, the flow rate of each carrier gas was set to 5 l/min., and the flow rates of TMG and TMA were set to 30 cc/min. and 100 cc/min., respectively. The flow rates of ammonia and silane were set to 5 l/min. and 1 cc/min., respectively. Thereafter, all of these gases except the TMA were continued to flow for about one hour to form the n-type GaN layer 607. SubsequentLy, the reaction chamber was cooled down to room temperature while allowing only nitrogen gas to flow at a flow rate of 10 l/min., and then the wafer having these growth layers was taken out of the reaction chamber.

Then, a $SiO_2$ film 610 was formed up to a thickness of 0.5 $\mu$m on the n-type GaN layer 607 by means of the known thermal CVD method. This $SiO_2$ film 608 was then subjected to a photoetching process to form an opening having a width of 10 $\mu$m therein. Thereafter, a Ti film 50 nm in thickness and an Au film 3 $\mu$m in thickness were successively formed on the upper surface of the opening by means of the known vacuum vapor reposition method to form the Ti/Au laminate electrode 611. Another Ti/Au laminate electrode 611 having the same thickness as mentioned above was also formed on the back surface of the SiC substrate 601.

In this semiconductor element, carbon (C) is contained in the p-type GaN layer 603 and the p-type AlGaN layer 604 at a concentration of about $1\times10^{17}$ cm$^{-3}$. This is because the concentration of carbon corresponds to the carrier concentration in the undoped GaN film. In this embodiment, although the concentration of carbon in the p-type layers was set to the above value, the concentration of carbon should not be construed to be limited to this value. Since the concentration of residual donor fluctuates according to the conditions of growing crystals, the concentration of carbon for compensating the residual donor concentration may be suitably determined according to the conditions of growing crystals.

The wafer thus manufactured was then cleaved into laser diode chips each having a size of 350 $\mu$m$\times$500 $\mu$m. The chip thus obtained showed, though being dependent on the In-containing composition of the active layer, a continuous oscillation with a wavelength of 420 nm at room temperature.

Although C (carbon) was employed as an impurity for compensating the residual donors in the aforementioned example, it is also possible to employ Zn, Cd, Ti and Fe as such an impurity. These impurities may be introduced into a layer during the crystal growth thereof by making use of an organometallic raw material such as dimethylcadmium. Alternatively, a film of these metals may be formed by means of sputtering for instance on the surface of a crystal which has been grown in advance, and subsequently the resultant film is heated so as to diffuse these metals as an impurity into the crystal. Furthermore, these metals may be introduced into a crystal which has been grown in advance by making use of an ion implantation. If this ion implantation is employed, a heat treatment should preferably be performed after the ion implantation since the ion implantation is known to cause a disorder of crystal.

The preferable range in concentration of these impurities varies depending on the kinds of impurity. For example, in the case of Zn and Cd, an impurity concentration in the range of from $1\times10^{15}$ cm$^{-3}$ to $1\times10^{18}$ cm$^{-3}$ is preferable. In the case of Ti and Fe, an impurity concentration in the range of from $1\times10^{13}$ cm$^{-3}$ to $1\times10^{16}$ cm$^{-3}$ is preferable. Excessive addition over these upper limits of any of these impurities may prevent Mg from being activated and becoming acceptor. On the other hand, if the concentration of these impurities is less than these lower limit, the function of these impurities to compensate the residual donors can hardly be realized.

Although a substrate of 6H-type is employed as a SiC substrate in this example, there is an energy gap of about 0.5V between the 6H-type substrate and the GaN-based semiconductor, thereby raising an operation voltage. Therefore, it is preferable to employ a SiC substrate of 4H-type or 2H-type, which is capable of minimizing the energy gap.

SiC employed in this example is a material which can be hardly etched as in the case of the GaN-based semiconductor. Therefore, it is preferable, in view of facilitating the etching, to add nitrogen at a concentration of $1\times10^{17}$ cm$^{-3}$ or more. However, nitrogen in this SiC is an effective donor impurity. Moreover, the residual donors are included in this SiC at a concentration of about $2\times10^{16}$ cm$^{-3}$. Therefore, it is required to compensate these donors by the addition of acceptor impurity so as to realize a p-type SiC crystal having a high carrier concentration. In particular, the interface between the p-type layer and the electrode on the surface of substrate is in need of this requirement to compensate the donors by the addition of acceptor impurity for the purpose of lowering the operation voltage. As for the impurities, Al, Ga, In, Sc, Y and Ti may be employed. Preferable concentration of these impurities varies depending on the kind of impurity. For example, in the case of Ga and Sc, a preferable concentration thereof may be about $1\times10^{17}$ cm$^{-3}$.

EXAMPLE II-11

FIG. 14 illustrates a cross-sectional structure of another semiconductor laser 700 according to this Example. The laser 700 comprises a sapphire substrate 701 having a c-face as a principal plane, on which a GaN buffer layer 702 (about 50 nm in thickness), an undoped GaN layer 703 (about 2 $\mu$m in thickness) and an n-type GaN contact layer 704 (about 4 $\mu$m in thickness) are formed in the mentioned order. On this n-type GaN contact layer 704, there are further superimposed an n-type AlGaN clad layer 705 (about 0.2 $\mu$m in thickness), an n-type GaN guide layer 706 (about 0.1 $\mu$m in thickness), an InGaN active layer 707 of a multiple quantum well structure (MQW) comprising a 2 nm thick well layer and a 4 nm thick barrier layer, a p-type GaN guide layer 708 (about 0.1 $\mu$m in thickness), a p-type AlGaN clad layer 709 (about 0.2 $\mu$m in thickness), a p-type GaN layer 710 (about 0.5 $\mu$m in thickness), an n-type GaN layer 711 (1 $\mu$m in thickness), a p-type GaN layer 712 (about 2 $\mu$m in thickness) and a high concentration p-type contact layer 713 (about 0.2 $\mu$m in thickness) in the mentioned order.

Additionally, a Pt/Ti/Pt/Au laminate electrode 722 which is defined into a stripe by the presence of a 0.5 $\mu$m thick $SiO_2$ film 720 is deposited on the p-type contact layer 713. Furthermore, a Ti/Au laminate electrode 721 is also formed on the n-type GaN contact layer 704.

In the semiconductor laser 700 shown in FIG. 14, Mg, Si and C are added as impurities to the p-type contact layer 713 as this p-type contact layer 713 is required to be low in resistance in particular. The concentration of these impurities in this p-type contact layer 713 should desirably be about $2\times10^{20}$ cm$^{-3}$ with regard to Mg; and in the range of from $6\times10^{16}$ cm$^{-3}$ to $1\times10^{18}$ cm$^{-3}$, more preferably not more than $1\times10^{17}$ cm$^{-3}$ with regard to Si. As for the concentration of C, since carbon is required to concurrently compensate the Si to be added simultaneously and the residual donors, the concentration of C should preferably be in the range of from $1\times10^{16}$ cm$^{-3}$ to $1\times10^{17}$ cm$^{-3}$.

The same kinds of impurities may be added to other p-type layers, in addition to the p-type contact layer 713, such as the p-type GaN guide layer 708, the p-type AlGaN clad layer 709, the p-type GaN layer 710 and the p-type GaN layer 712. When these impurities are added in this manner, the diffusion of Mg can be suppressed and at the same time the activation degree of the dopant will be improved.

Next, the method of manufacturing the semiconductor laser 700 will be explained as follows.

First of all, the sapphire substrate 701 was subjected to an organic washing and acid washing. Then, the resultant sapphire substrate 701 was mounted on a susceptor which was placed in a reaction chamber of an MOCVD apparatus so as to be heated by means of a high-frequency wave. Then, the natural oxide film formed on the surface of the sapphire substrate 701 was removed by subjecting it to a vapor-phase etching at a temperature of 1,100° C. for about 10 minutes while allowing hydrogen gas to flow at a flow rate of 10 l/min. at normal pressure.

For the formations of semiconductor layers on this sapphire substrate 701, the temperature of the sapphire substrate 701 was lowered down to 530° C., and hydrogen gas, nitrogen gas, ammonia gas and TMG were allowed to flow for about 4 minutes to form the GaN buffer layer 702. The flow rate of each of hydrogen gas, nitrogen gas and ammonia gas was set to 15 l/min., 5 l/min., 10 l/min. and 25 cc/min., respectively.

Subsequently, the sapphire substrate 701 was heated up to 1,100° C. while allowing hydrogen gas (15 l/min.), nitrogen gas (5 l/min.) and ammonia gas (10 l/min.) to flow over the sapphire substrate 701. Then, the TMG (100 cc/min.) was added to these gases for a period of 60 minutes, thereby forming an undoped GaN layer 703. Thereafter, a SiH$_4$ gas flow (3 cc/min.) which had been diluted by the addition of hydrogen gas to 10 ppm was further added to the flow of aforementioned gases, and the combined gas flow was allowed to flow into the reaction chamber for about 130 minutes, thereby forming the n-type GaN layer 704.

Then, the TMA was further added at: a flow rate of 50 cc/min. and the resultant combined gas flow was allowed to flow for about 10 minutes to deposit the n-type AlGaN layer 705 on the n-type GaN layer 704. By the way, the ratio of Al in the n-type AlGaN layer 705 was controlled to 0.15.

Thereafter, the sapphire substrate 701 was again heated up to 1,100° C. and kept at this temperature, and at the same time, hydrogen gas (15 l/min.), nitrogen gas (5 l/min.), ammonia gas (10 l/min.) and TMG (100 cc/min.) were allowed to flow for about 3 minutes, thereby to form the GaN guide layer 706. Since this guide layer functions to improve the confinement of light, a trace amount of In may be added to this guide layer. It is required in this case however to suitably change the thickness of the guide layer.

Subsequently, the sapphire substrate 701 was cooled down to a temperature of 800° C. and maintained at this temperature while allowing ammonia gas (10 l/min.) and nitrogen gas (20 l/min.) to flow thereover. Then, two kinds of flow rates of TMI were alternately allowed to flow while flowing TMG (310 cc/min.), whereby forming the InGaN layer 707 having a multiple quantum well of 15 periods. In this case, the TMI was allowed to flow at first for 15 periods, each period being consisted of one-minute supply at a flow rate of 50 cc/min. followed by 30-second supply at a flow rate of 460 cc/min., and finally the TMI was allowed to flow three minutes at the flow of 50 cc/min. The resultant barrier layer constituting the active layer 707 was found to contain 5% of In and have a thickness of 4 nm, while the well layer was found to contain 20% of In and have a thickness of 2 nm.

According to this example, an InGaN containing 5% of In was employed as a barrier layer, and an InGaN containing 20% of In was employed as a well layer. However, this invention is not limited to this construction. Since it is required for a multiple quantum well structure to make the band gap energy of the barrier layer larger than that of the well layer, it is possible to employ GaN and AlGaN as a barrier layer. In this case, the guide layers 706 and 708 are required to be formed of a material which is lower in refractive index as compared with an average refractive index of the active layers. For example, when a GaN layer is employed as a barrier layer, and an InGaN layer comprising 20% of In and having the same thickness as that of the GaN layer is employed as a well layer, any of InGaN comprising less than 10% of In, GaN or AlGaN will be employed as a guide layer. It is of course necessary in this case to control the content of In to less than that of the clad layer.

Subsequently, the sapphire substrate 701 was heated up to 1,100° C. over about three minutes, while allowing nitrogen gas (20 l/min.) and ammonia gas (10 l/min.) to flow thereover. Then, while maintaining this temperature, hydrogen gas (15 l/min.), nitrogen gas (5 l/min.), ammonia gas (10 l/min.), TMG (100 cc/min.) and Cp$_2$Mg (50 cc/min.) were allowed to flow into the reaction chamber for about 3 minutes, thereby forming the p-type GaN guide layer 710.

Then, the supply of Cp$_2$Mg was stopped, and silane (3 cc/min.) was additionally supplied to the remaining gas flow thereby to form the n-type GaN layer 711. Subsequently, the supply of TMG and silane was stopped and the sapphire substrate was allowed to be cooled down to 350° C. While keeping this temperature, the supply of hydrogen gas and ammonia gas was stopped and the sapphire substrate was allowed to be cooled down to room temperature. Subsequently, the wafer thus grown was taken out of the reaction chamber.

Then, a predetermined region of the n-type GaN layer 711 was removed by means of etching employing a SiO$_2$ film (formed through a thermal CVD method) and a photoresist film as a mask, thereby forming a stripe-like opening having a width of 5 $\mu$m and exposing the surface of the p-type GaN layer 710.

Then, the wafer thus treated with the aforementioned processes was re-mounted on a susceptor placed in the MOCVD apparatus and heated up to 1,100° C. while allowing hydrogen gas (15 l/min.), nitrogen gas (5 l/min.) and ammonia gas (10 l/min.) to flow over the wafer. Then, TMG (100 cc/min.) and Cp$_2$Mg (50 cc/min.) were additionally supplied to the gas flow and allowed to flow into the reaction chamber for about 60 minutes, thereby forming the p-type GaN layer 712.

This growing step should preferably be performed by way of a low temperature growth process. This low temperature growth process can be performed as follows. Namely, the wafer is heated up to 550° C. over about three minutes, while allowing nitrogen gas to be fed at a flow rate of about 20 l/min. and ammonia gas to be fed at a flow rate of 10 l/min. Then, while maintaining this temperature, hydrogen gas (15 l/min.), nitrogen gas (5 l/min.), ammonia gas (10 l/min.), TMG (25 cc/min.) and Cp$_2$mg (50 cc/min.) were allowed to flow for about 4 minutes, thereby to form a p-type GaN layer having a thickness of about 50 nm. In this example, the GaN layer immediately after the formation thereof was found to be polycrystal having an orientation in c-axis.

Then, nitrogen gas (20 l/min.), ammonia gas (10 l/min.), TMG (100 cc/min.), Cp$_2$Mg (150 cc/min.), silane (1 cc/min.) and propane (2 cc/min.) were allowed to flow for 6 minutes, thereby forming the p-type GaN contact layer 713. By incorporating Si and C into the contact layer in this manner, the activation degree could be improved by three times and at the same time the diffusion of Mg could be substantially suppressed as compared with the case where Si and C were not incorporated into the contact layer. Thereafter, the wafer was cooled down to room temperature while allowing only nitrogen gas to flow at a flow rate of 10 l/min. and then the wafer thus grown was taken out of the reaction chamber.

Then, a SiO$_2$ film 720 was formed up to a thickness of 0.5 mm on the p-type GaN contact layer 713 by means of the known thermal CVD method. This SiO, film 720 was then subjected to a photoetching process to part of the SiO$_2$ film 720. Thereafter, the upper layers were removed by means of a reactive ion etching using a chlorine gas, etc. and employing this SiO$_2$ film 720 and a photoresist pattern as an etching mask, thereby exposing the surface of the n-type GaN layer 704.

Further, a Ti film 50 nm in thickness and an Au film 0.5 $\mu$m in thickness were successively deposited by means of known vacuum vapor deposition method or sputtering method on a portion of the n-type GaN layer 704 to form a Ti/Au laminate structure, which was then heat-treated in a nitrogen atmosphere for 30 seconds at a temperature of 450° C., thereby forming an n-side electrode 721.

On the other hand, a Pt film 10 nm in thickness, a Ti film 50 nm in thickness, a Pt film 30 nm in thickness and an Au film 1 $\mu$m in thickness were successively deposited by means of known vacuum vapor deposition method or sputtering method on the approximately entire surface of the p-type GaN layer 713, and the resultant laminate was then heat-treated in a nitrogen atmosphere for 30 seconds at a temperature of 300° C., thereby forming a p-side electrode 722.

As for the electrode material, it is possible, in addition to the aforementioned examples, to employ for instance Al, Ag, Ni, Cr, Mg, Si, Zn, Be, Ge, In, Pd and Sn. These metals may be a single layer, a laminate structure or an alloy.

For the purpose of improving the adhesivity of bonding, a Cr film about 5 nm in thickness and an Au film about 1 $\mu$m in thickness were successively deposited on the aforementioned electrodes 721 and 722, thereby forming an electrode pad, respectively. When a bonding is performed on these pads by making use of Au, etc., the element will be actuated.

The element provided with electrodes as mentioned above was subjected to an abrasion wherein the back surface (a surface opposite to that where elements were formed) of the sapphire substrate 701 was abraded down to a depth of not more than 60 $\mu$m, and then to a line scribing to be cleaved into chips each having a size of about 500 $\mu$m×1 mm. In this case, the chip was formed such that the end face of laser was constituted by the A-face, i.e. (11–20) face of the GaN-based material.

Subsequently, a multi-layer film comprising a SiO$_2$ film and a TiO$_2$ film was formed on the surface to be formed into the end face of a laser with a view to improve the reflectance of the end face of laser.

The semiconductor laser 700 manufactured in this manner could be actuated with a threshold current density of 3 kA/cm$^2$.

The semiconductor laser 700 could be oscillated, though being dependent on the average ratio of In in the composition of the active layer 707, with a wavelength of 390 to 450 nm.

As explained above, it is possible according to this invention to realize a p-type crystal having a high carrier concentration by an addition of a little amount of impurity, thereby improving the efficiency of element. The realization of a p-type crystal having a high carrier concentration will lead to the improvement in reliability of an element, and therefore is valuable in industrial view point.

Additional advantages and modifications will readily occur to those skilled in the art. Therefore, the invention in its broader aspects is not limited to the specific details, representative devices, and illustrated methods shown and described herein. Accordingly, various modifications may be made without departing from the spirit or scope of the general inventive concept as defined by the appended claims and their equivalents.

We claim:

1. A semiconductor light-emitting diode comprising:

a substrate;

an n-type compound semiconductor layer formed on said substrate;

a light-emitting layer formed directly on said n-type compound semiconductor layer; and a p-type compound semiconductor layer formed on said light-emitting layer, wherein said p-type compound semiconductor layer comprises at least two p-type compound semiconductor sublayers, and an uppermost one of said at least two p-type compound semiconductor sublayers contains Mg, Si and one or more impurities for compensating residual donors, said one or more impurities being at least one selected from the group consisting of Zn, Cd, Ti, Fe and Ni.

2. The semiconductor light-emitting diode according to claim 1, wherein an InGaN buffer layer is interposed between said substrate and said n-type compound semiconductor layer.

3. The semiconductor light-emitting diode according to claim 1, wherein said compound semiconductor is a GaN-based semiconductor.

4. A group III–V compound semiconductor light-emitting element comprising:

a p-n junction capable of emitting light through a recombination of electrons and holes;

a p-type layer formed on said p-n junction and containing Mg and Zn as an acceptor impurity for compensating residual donors, a concentration of atoms of said Zn being 1×10$^{18}$/cm$^3$ or less.

5. The light-emitting element of claim 4, wherein said light-emitting element is a semiconductor laser and a concentration of atoms of said Zn is in a range from 1×10$^{15}$/cm$^3$ to 1×10$^{18}$/cm$^3$.

6. The light-emitting element of claim 5, wherein said p-type layer further contains Si.

7. The light-emitting element of claim 4, wherein said light-emitting element is a light-emitting diode and a concentration of atoms of said Zn is in a range from 1×10$^{14}$/cm$^3$ to 1×10$^{17}$/cm$^3$.

8. The light-emitting element of claim 4, wherein said group III–V compound semiconductor is a GaN-based semiconductor.

* * * * *